(12) United States Patent
Guetig et al.

(10) Patent No.: US 9,040,824 B2
(45) Date of Patent: May 26, 2015

(54) TWINAXIAL CABLE AND TWINAXIAL CABLE RIBBON

(75) Inventors: Keith Guetig, Louisville, KY (US); Shashi Chuganey, Milwaukie, OR (US); Travis Ellis, Portland, OR (US); Eric Korff, Jeffersonville, IN (US)

(73) Assignee: Samtec, Inc., New Albany, IN (US)

( * ) Notice: Subject to any disclaimer, the term of this patent is extended or adjusted under 35 U.S.C. 154(b) by 37 days.

(21) Appl. No.: 13/479,521

(22) Filed: May 24, 2012

(65) Prior Publication Data

US 2013/0312992 A1   Nov. 28, 2013

(51) Int. Cl.
| | |
|---|---|
| H01B 11/06 | (2006.01) |
| H01B 11/20 | (2006.01) |
| H01R 12/59 | (2011.01) |
| H01R 12/62 | (2011.01) |
| H05K 3/34 | (2006.01) |
| H01B 7/08 | (2006.01) |

(52) U.S. Cl.
CPC ............ H01B 11/203 (2013.01); H01B 7/0838 (2013.01); H01R 12/598 (2013.01); H01R 12/62 (2013.01); H05K 3/3421 (2013.01); H05K 2201/10356 (2013.01)

(58) Field of Classification Search
CPC ...... H01B 7/08; H01B 7/0807; H01B 7/0823; H01B 7/0861; H01B 7/0838; H01B 11/02; H01B 11/04; H01B 11/06; H01B 11/08; H01B 11/085; H01B 11/203; H01B 11/20; H01B 9/02; H05K 9/0098
USPC .............. 174/102 R, 103, 104, 106 R, 110 R, 174/113 R, 113 A, 117 R, 117 F, 350
See application file for complete search history.

(56) References Cited

U.S. PATENT DOCUMENTS

| 5,552,565 A | 9/1996 | Cartier et al. |
|---|---|---|
| 6,421,487 B1 | 7/2002 | Hutton et al. |

(Continued)

FOREIGN PATENT DOCUMENTS

| JP | 2001-356252 A | 12/2001 |
|---|---|---|
| KR | 10-2002-0017387 A | 10/2003 |
| WO | 2012039736 A1 | 3/2012 |

OTHER PUBLICATIONS

Official Communication issued in International Patent Application No. PCT/US2013/026305, mailed on Jun. 26, 2013.

(Continued)

*Primary Examiner* — Hoa C Nguyen
*Assistant Examiner* — Amol Patel
(74) *Attorney, Agent, or Firm* — Keating & Bennett, LLP

(57) ABSTRACT

A cable ribbon includes a first and second twinaxial cables and an outer layer surrounding the first and second twinaxial cables. The first twinaxial cable includes two first wires that are parallel or substantially parallel to each other along a longitudinal axis of the twinaxial cable ribbon, a first insulator surrounding each of the two first wires along the longitudinal axis, and a first conductive shield surrounding the first insulator along the longitudinal axis. The second twinaxial cable includes two second wires that are parallel or substantially parallel to each other along the longitudinal axis, a second insulator surrounding each of the two second wires along the longitudinal axis, and a second conductive shield surrounding the second insulator along the longitudinal axis. The first and second conductive shields are in direct contact with each other.

20 Claims, 23 Drawing Sheets

(56) References Cited

U.S. PATENT DOCUMENTS

| | | | |
|---|---|---|---|
| 8,440,910 B2* | 5/2013 | Nonen et al. | 174/115 |
| 2002/0025128 A1 | 2/2002 | Hwang | |
| 2003/0223714 A1 | 12/2003 | Conrad et al. | |
| 2006/0207784 A1* | 9/2006 | Chang | 174/88 C |
| 2010/0294557 A1 | 11/2010 | Cases et al. | |
| 2010/0307790 A1 | 12/2010 | Okano | |
| 2011/0100682 A1 | 5/2011 | Nonen et al. | |
| 2012/0285723 A1 | 11/2012 | Gundel et al. | |
| 2012/0298395 A1 | 11/2012 | Gundel | |
| 2013/0146326 A1 | 6/2013 | Gundel et al. | |
| 2013/0168149 A1* | 7/2013 | Gundel | 174/350 |
| 2013/0264089 A1 | 10/2013 | Gundel | |
| 2013/0333936 A1 | 12/2013 | Gundel | |
| 2014/0000930 A1 | 1/2014 | Gundel | |
| 2014/0000931 A1 | 1/2014 | Gundel et al. | |

OTHER PUBLICATIONS

Gundel, "Shielded Electrical Cable in Twinaxial Configuration," U.S. Appl. No. 13/520,347, filed Jul. 3, 2012.

Gundel, "High Speed Transmission Cable," U.S. Appl. No. 13/985,070, filed Aug. 13, 2013.

\* cited by examiner

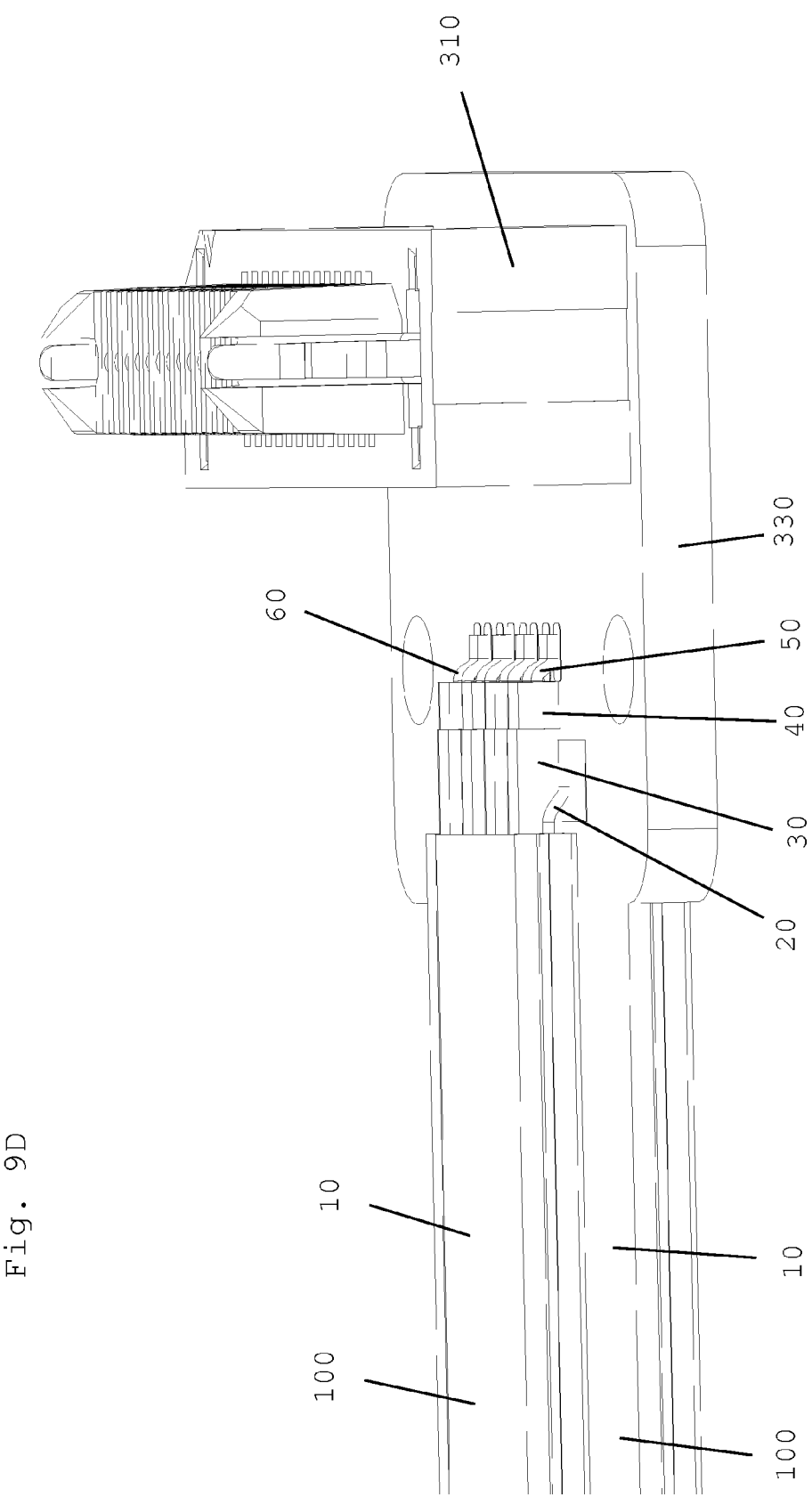

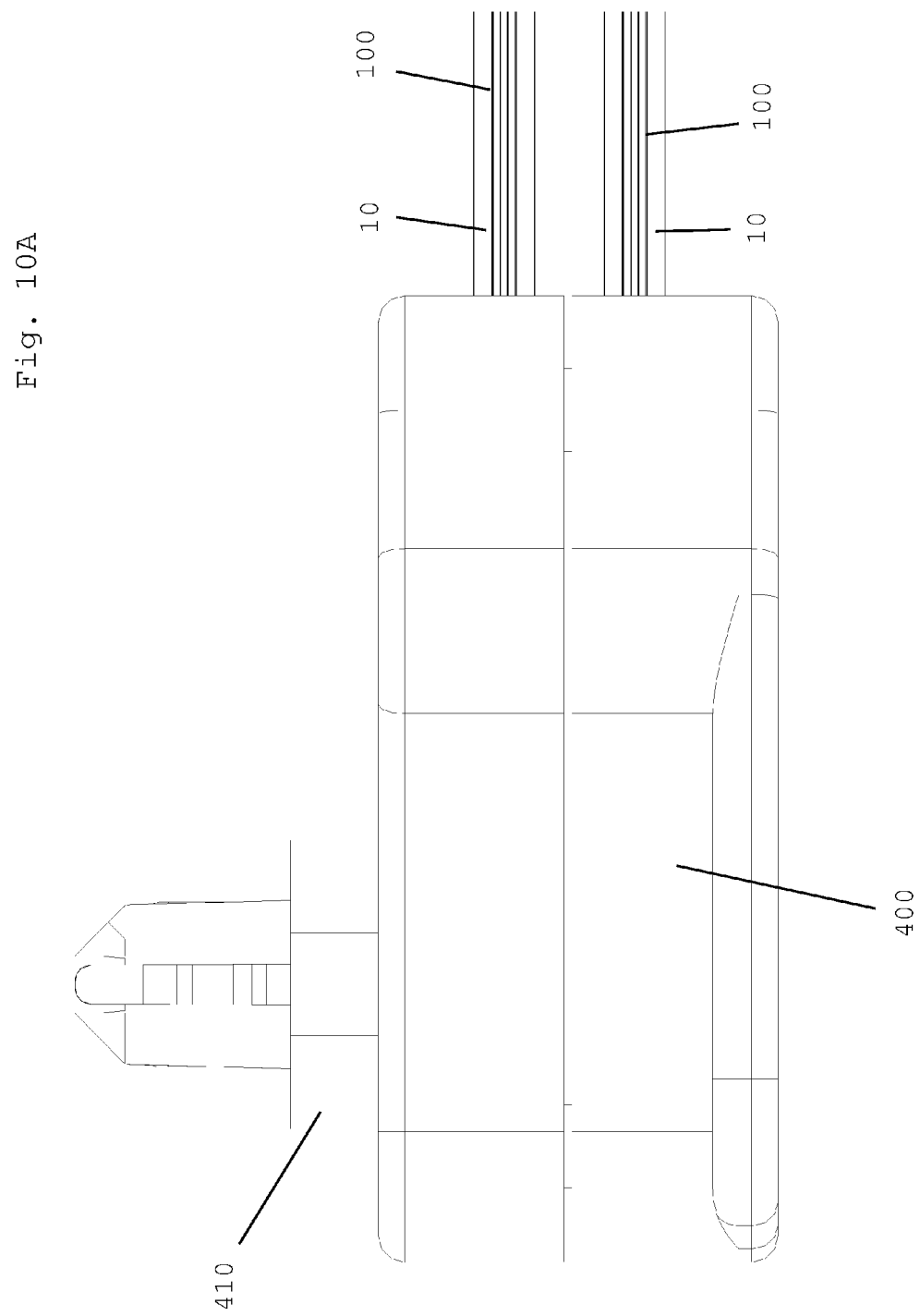

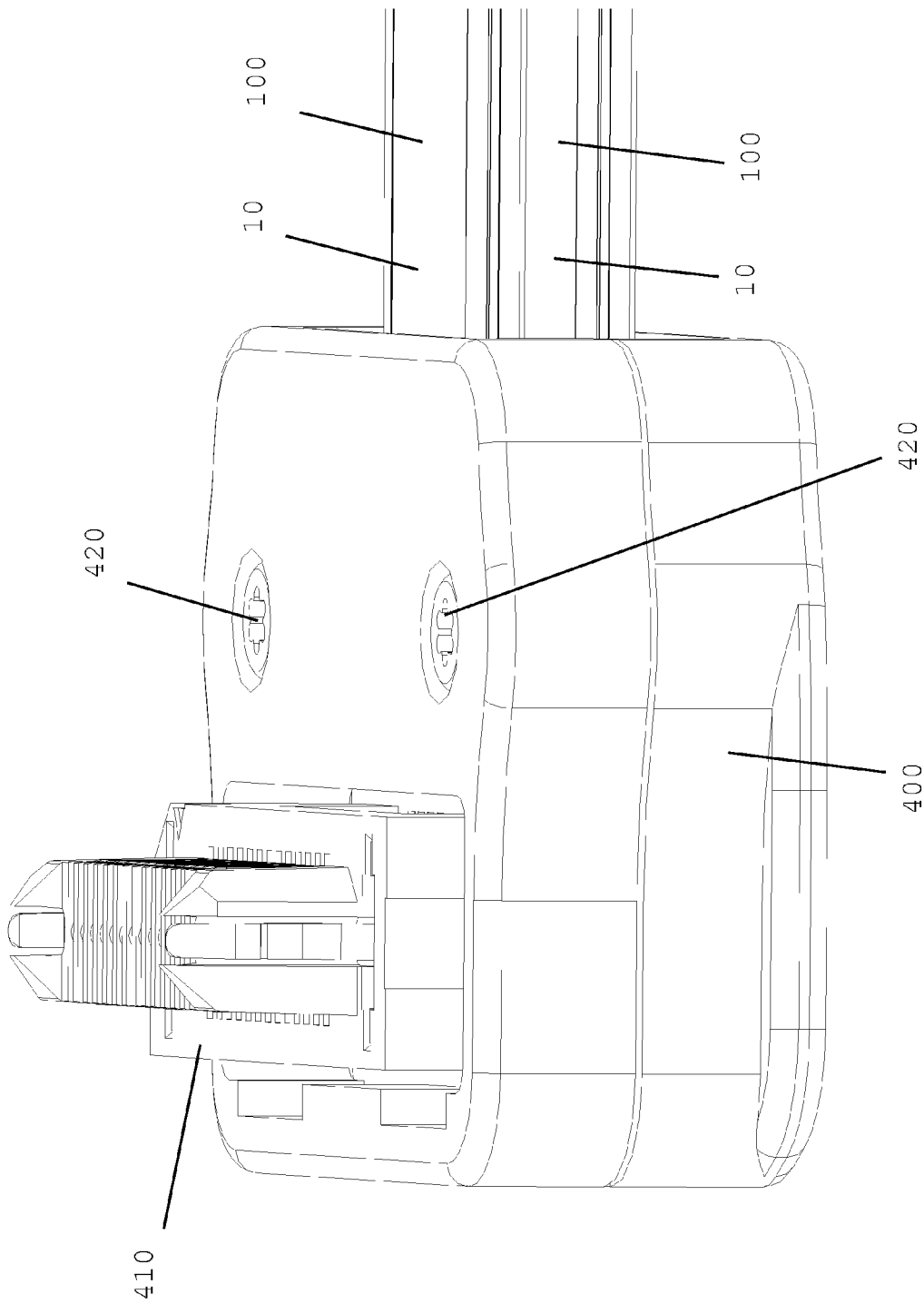

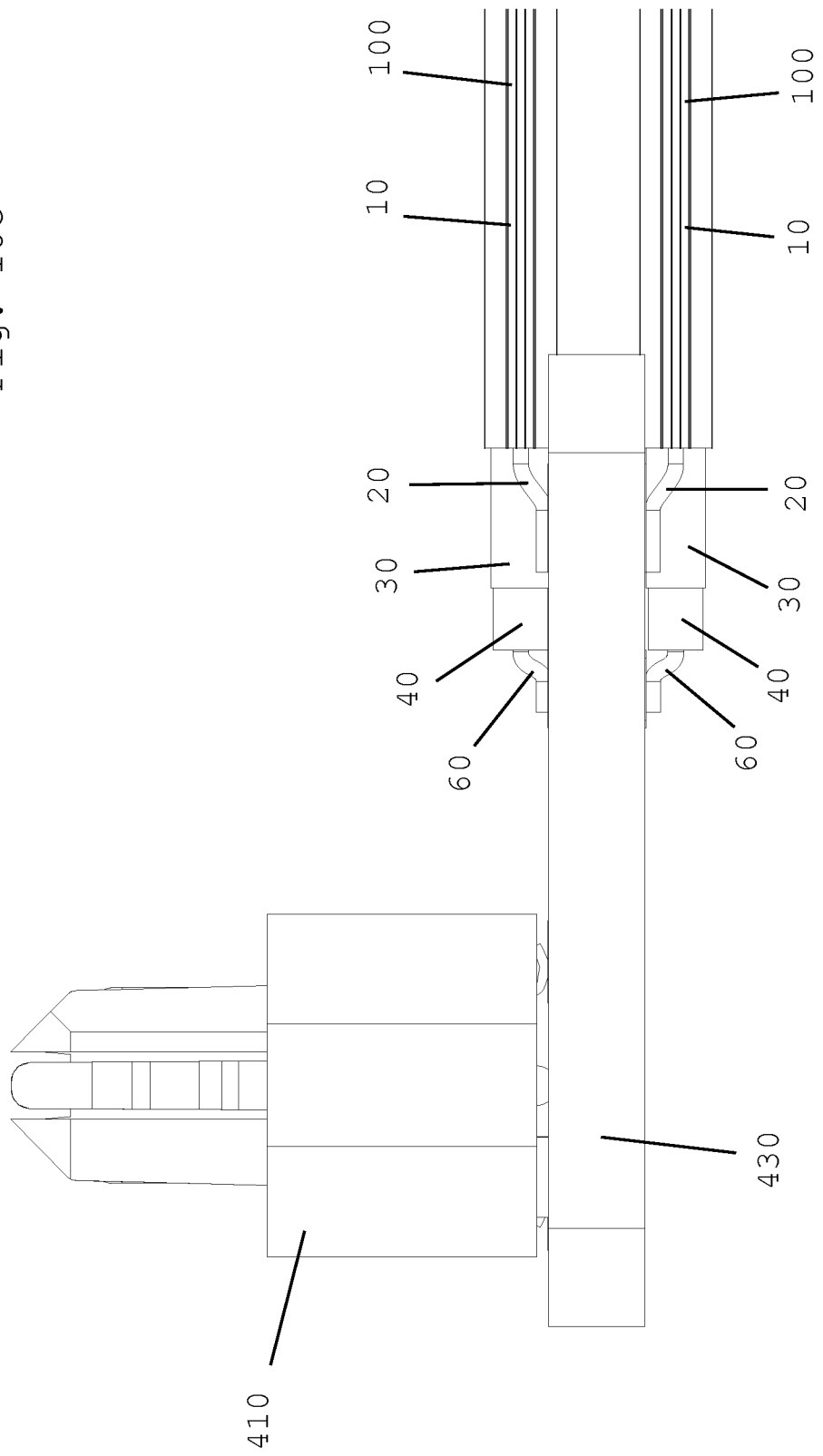

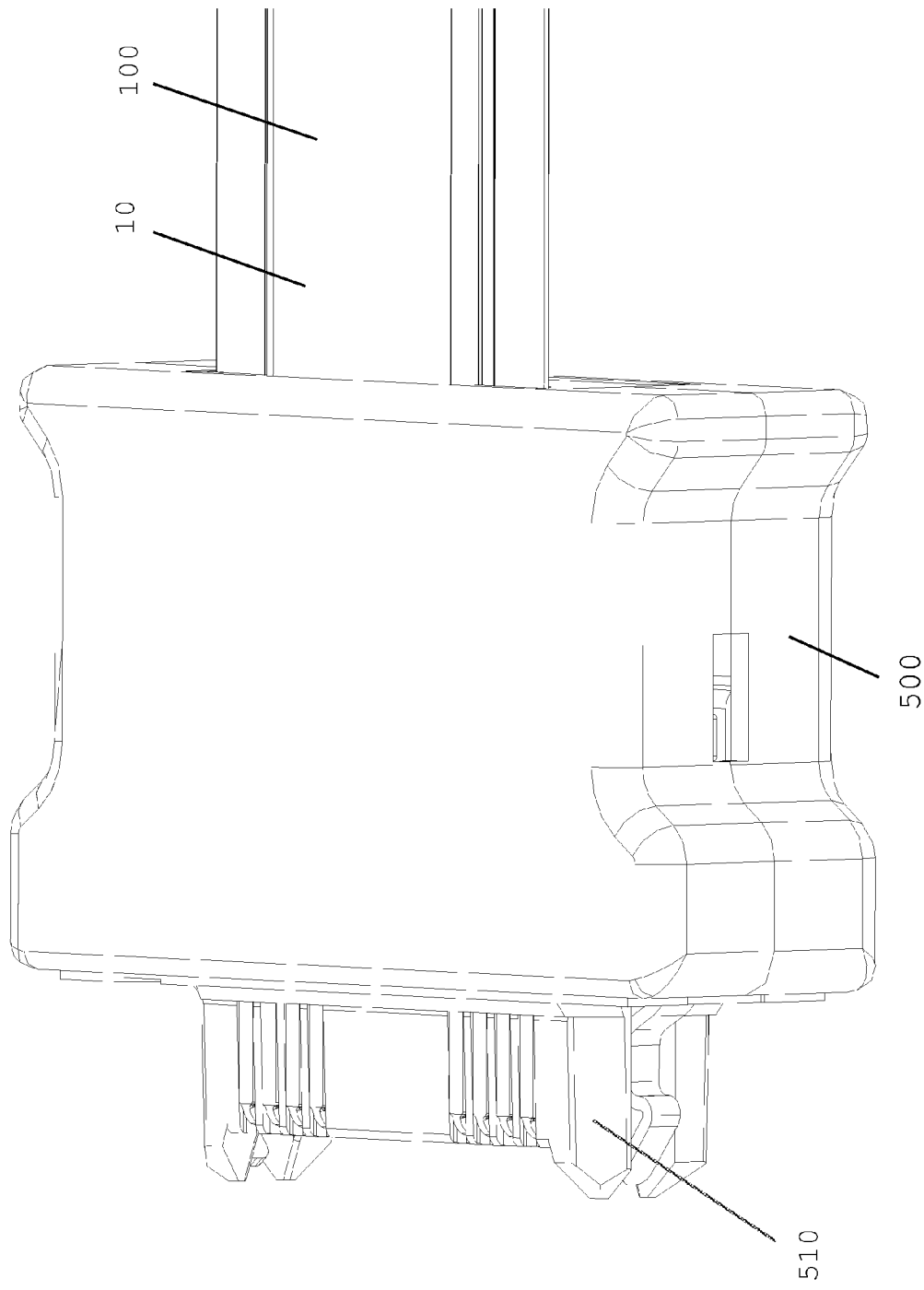

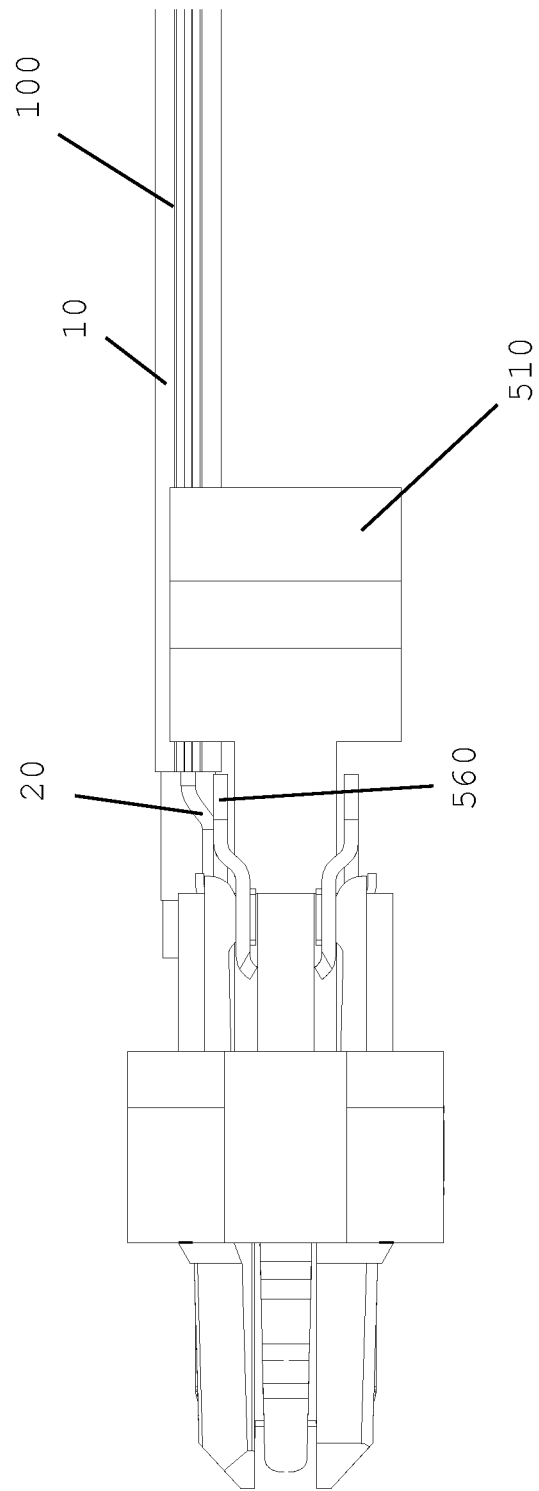

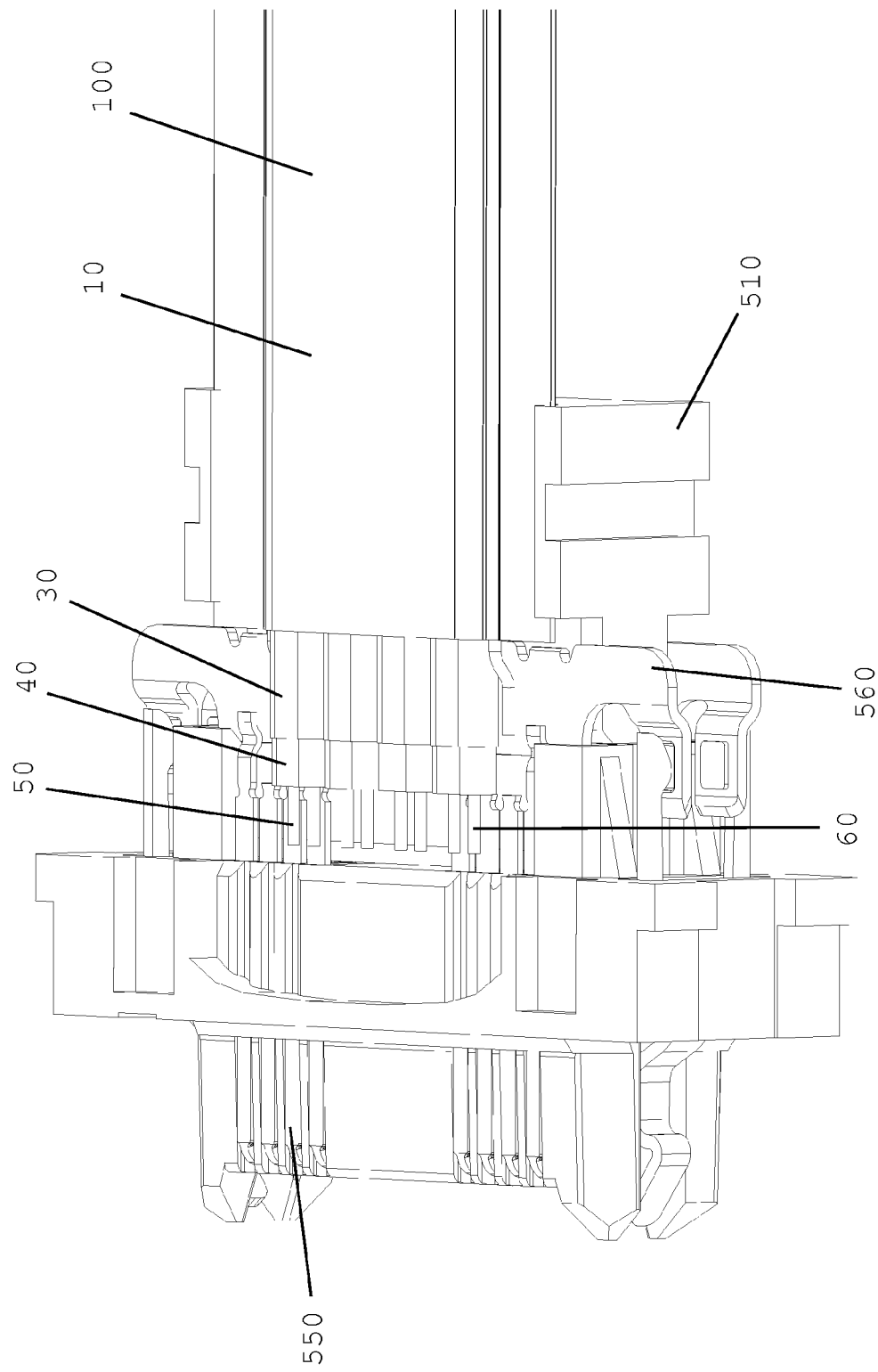

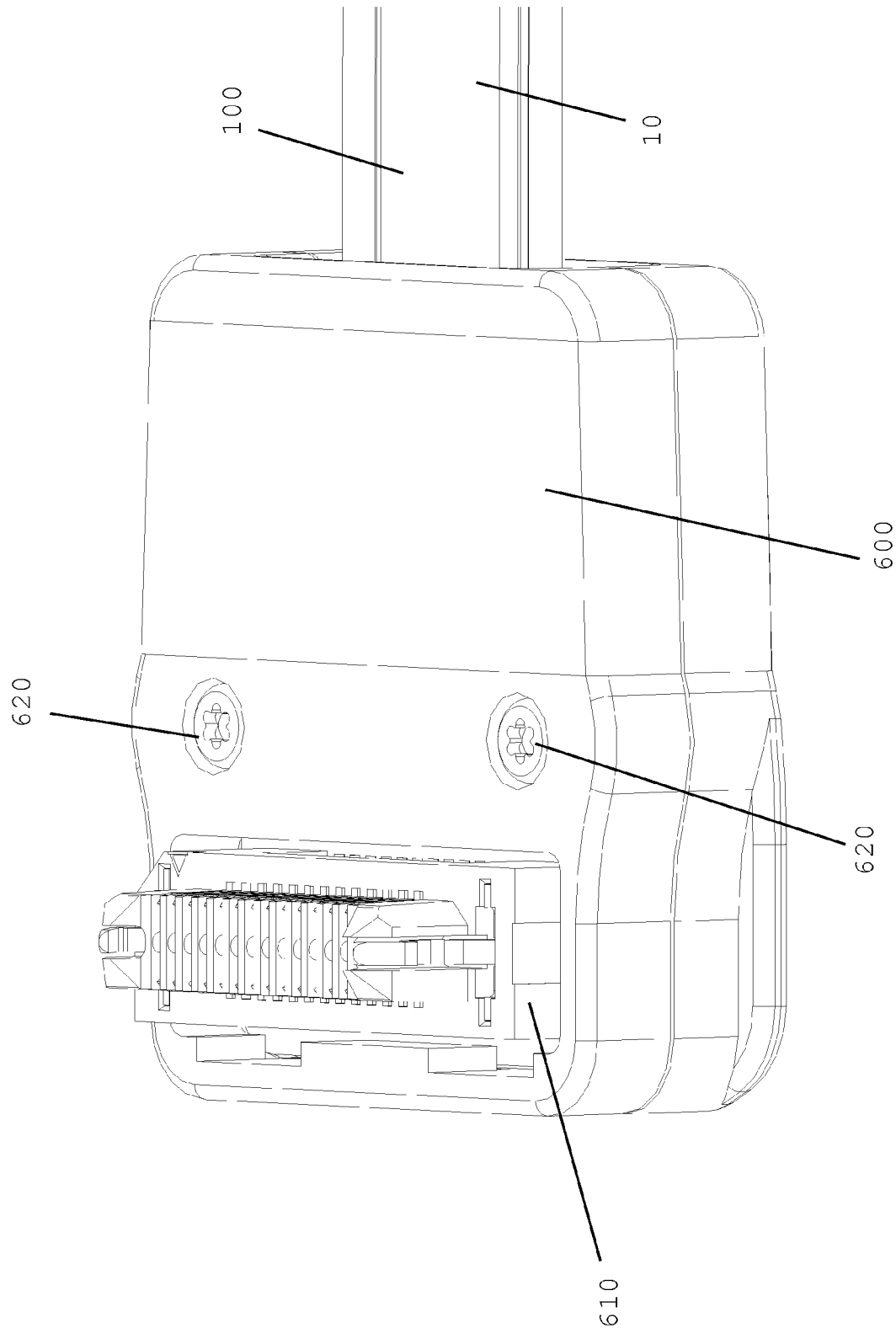

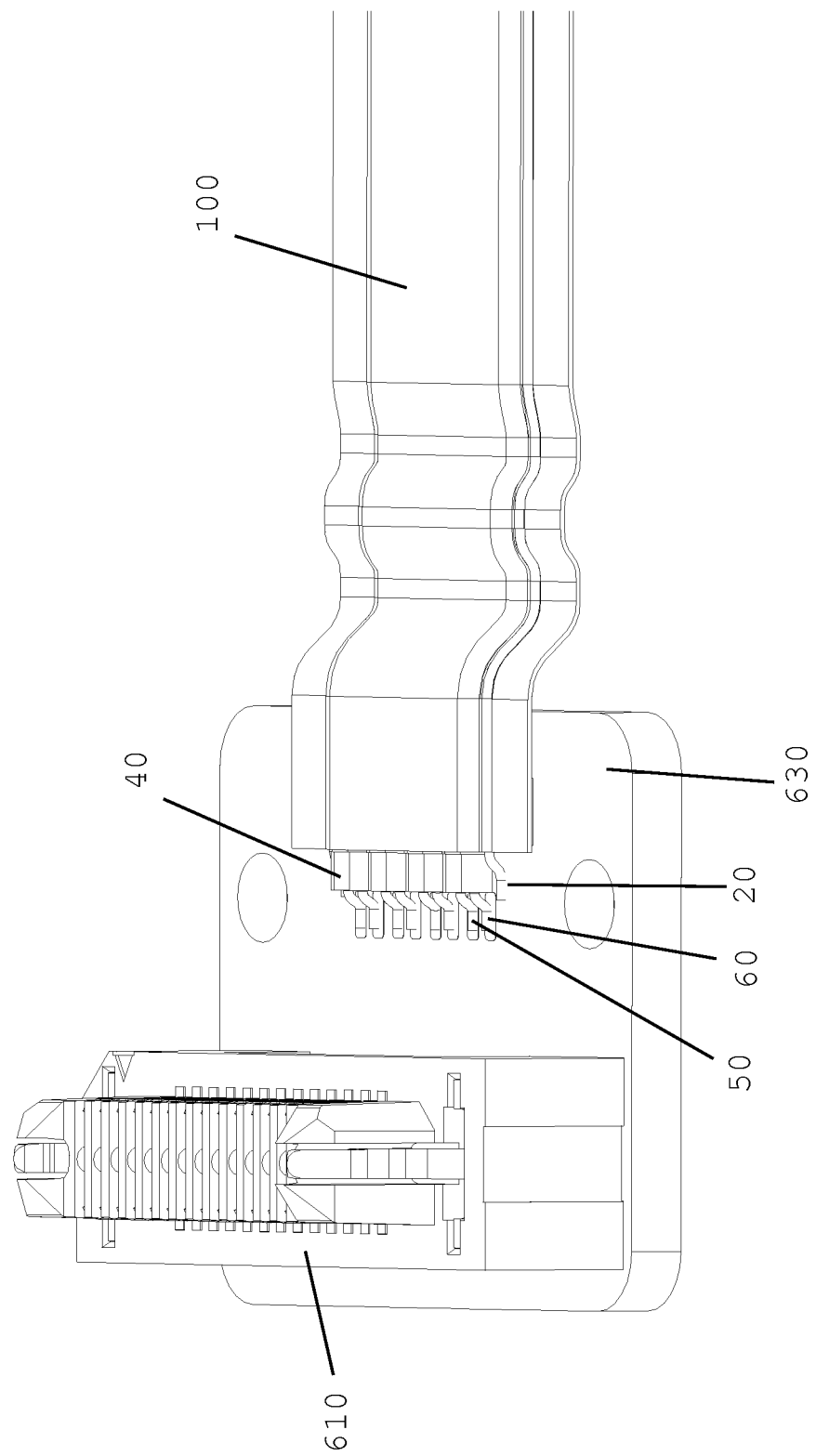

TWINAXIAL CABLE AND TWINAXIAL CABLE RIBBON

BACKGROUND OF THE INVENTION

1. Field of the Invention

The present invention relates to twinaxial cables, and more specifically, the present invention relates to twinaxial cable ribbon.

2. Description of the Related Art

Coaxial cables include a center conductor surrounded by an insulation layer and a conductive shield covering the insulation layer. Typically, a protective layer covers the conductive shield.

Twinaxial cables are similar to coaxial cables, but contain two center conductors instead of one. The two center conductors of a twinaxial cable are each surrounded by an insulation layer. Typically, the insulation layers for each of the two center conductors of twinaxial cables are separately formed. A conductive shield covers the insulation layers.

Twinaxial cables are often used to provide high-speed differential signaling in electrical devices. For example, in differential signaling, complementary signals may be sent on respective center conductors of a pair of center conductors.

Typical applications for twinaxial cables include those applications in which a differentially controlled impedance is required to transfer data at a high rate. These typical applications require a high-performance electrical path across longer distances and/or a system architecture with inherent signal routing or mechanical packaging problems that can only be overcome by thin, fine-pitch, flexible, high-performance twinaxial cable. Typical applications include, for example, datacenter servers and other modules, supercomputing, medical imaging, and military applications.

Twinaxial cables are conventionally manufactured as a ribbon that includes two or more pairs of center conductors for carrying two or more differential signals. Thus, in a twinaxial cable ribbon, multiple twinaxial cables are provided. Each of the twinaxial cables includes two center conductors, each of the two center conductors is surrounded by a insulation layer, and a conductive shield covering the insulation layer.

Twinaxial cable ribbons are manufactured in several ways. For example, one known method, shown in FIG. 7, laminates an adhesive metal tape 1080 across several twinaxial cables. The thermal set adhesive used in the adhesive metal tape 1080 increases the resistance of this conventional laminated twinaxial cable ribbon. Further, a space or gap is typically provided between each of the twinaxial cables in the laminated twinaxial cable ribbon 1000 such that the center-to-center distance of two adjacent twinaxial cables is about 3 mm or more. This space is required to prevent crosstalk between adjacent twinaxial cables. Crosstalk between adjacent twinaxial cable pairs can easily occur because a conductive shield is not provided around the insulation layers 1040, 1045 around each of the center conductors 1050, 1060.

Another problem with laminating the adhesive metal tape 1080 is the creation a tangent shield gap 1070 between the adhesive metal tape 1080 and the center conductors 1050, 1060. The tangent shield gap 1070 causes variations in the electrical properties of the twinaxial cables so that the laminated twinaxial cable ribbon 1000 cannot be used as a high performance cable because high performance cables require consistent electrical properties.

Another known method of manufacturing a ribbon uses a solvent to partially melt an outer layer of PVC and combine adjacent twinaxial cables. This method requires that each twinaxial cable of the ribbon have an outer PVC layer. A problem with this arrangement is that the outer PVC layer of each of the twinaxial cables increases the pitch between adjacent twinaxial cables. Other problems are that this method requires the use of expensive materials, such as Teflon®, and that it requires multiple extrusions steps to prepare each of the twinaxial cables.

Known twinaxial cable ribbon may also include one or more drain wires, each of the one or more drain wires being separated from the twinaxial cables by a certain distance. The one or more drain wires may be electrically connected to each of the conductive shields of the twinaxial cables in order to provide a convenient ground connection. As one example, described below, hot bar soldering may be used to electrically connect the one or more drain wires to each of the conductive shields.

FIG. 7 shows a conventional laminated twinaxial cable ribbon 1000. A first center conductor 1050 is surrounded by a first layer of insulation 1040. A second center conductor 1060 is surrounded by a second layer of insulation 1045.

As shown in FIG. 7, twinaxial cables of the conventional laminated twinaxial cable ribbon 1000 include a separate layer of insulation 1040, 1045 for each of the respective center conductors 1050, 1060. Furthermore, as shown in FIGS. 7 and 8, adjacent pairs of center conductors 1050, 1060 are spaced apart by about 3 mm or more.

A drain wire 1020 is separated by a certain distance from the closest pair of center conductors 1050, 1060. Accordingly, the drain wire 1020 is not in direct contact with the conductive shields of the first center conductor 1050 and the second center conductor 1060.

As shown in FIG. 8, one problem with conventional twinaxial cable ribbons is that a connection between the conventional twinaxial cable ribbon 1000 and a circuit board 1200 requires a large footprint 1210 on the circuit board 1200, due to the spacings between each of the twinaxial cables and the spacings between the one or more drain wires and the twinaxial cables. Typically, a circuit board has conductive pads aligned with the conductors and the drain wire(s) of a corresponding cable. The footprint 1210 on the circuit board 1200 for connecting to the conventional twinaxial cable ribbon 1000 refers to a surface area on the circuit board 1200 that is occupied for the layout of the electrical connections to the cable 1000. Accordingly, the spacings between the twinaxial cables and between the drain wires and the twinaxial cables result in a relatively low-density cable that requires a large footprint, which may increase the cost of a system that uses the conventional twinaxial cable ribbon.

Another problem with conventional twinaxial cables is a variation in the electrical properties among each of the layers of insulation, since each of the center conductors has a separate insulating dielectric layer. Since separately formed insulators do not have identical electrical properties, performance is degraded as compared to, for example, a pair of center conductors that share a single insulating layer. Separately formed insulating layers also require an additional assembly step in the manufacturing of conventional twinaxial cables, since multiple extrusion steps are required to form the insulation layers on each of the center conductors. Accordingly, the performance of the twinaxial cable may be further degraded due to stresses on the twinaxial cables during this extra manufacturing process.

An additional problem with conventional twinaxial cables is a non-constant distance between the center conductors of a differential pair due to shifting of the separately formed insulators during twisting, bending, stretching, or similar stresses of which twinaxial cables are often subjected. Furthermore, any shifting of the relative positions of each of the center conductors may cause variation in the electrical properties of the twinaxial cables.

A further problem with conventional twinaxial cable ribbons is creating the connections between the conductive shields and the center conductors of the twinaxial cables and a circuit board. For example, it is known to create these connections using hand soldering and hot bar soldering. Hand soldering is time consuming and expensive. Hot bar soldering has been used as a convenient process to obtain a common electrical connection between the conductive shields and the center conductors of the twinaxial cables of conventional twinaxial cable ribbons and a circuit board. A problem with conventional hot bar soldering is that it requires two hot bar solder steps: once to solder the conductive shields and once to solder the center conductors. In conventional twinaxial cable ribbons that use drain wires, it is possible to connect the drain wire to the conductive shields of the twinaxial cables using hot bar soldering.

In a typical hot bar soldering process, each of two elements that are to be connected are separately coated with a layer of solder. The two elements are then pressed together and then heated to melt, or reflow, both layers of solder. After heating, the elements are cooled while still being pressed together, and an electro-mechanical connection is obtained when the solder solidifies.

However, hot bar soldering a served or braided conductive shield requires the use of materials that can withstand the high temperatures applied during the heating step of the hot bar soldering process. Accordingly, the insulation layers of conventional twinaxial cables must be formed of expensive dielectric materials that can withstand the high temperatures used in hot bar soldering. A common dielectric material used for insulation layers in conventional twinaxial cables is fluorinated ethylene propylene (FEP). Lower cost dielectric materials, such as polypropylene, are unable to withstand the temperatures applied in hot bar soldering a served or braided conductive shield.

SUMMARY OF THE INVENTION

Preferred embodiments of the present invention provide a low cost, high speed twinaxial cable ribbon with high signal integrity and quality and an improved cable density that allows for a smaller footprint area compared to conventional twinaxial cable ribbons. Preferred embodiments of the present invention also ensure a consistent distance between two center conductors of a twinaxial cable.

A preferred embodiment of the present invention includes a cable ribbon including first and second twinaxial cables and an outer layer surrounding the first and second twinaxial cables. The first twinaxial cable includes two first wires that are parallel or substantially parallel to each other along a longitudinal axis of the twinaxial cable ribbon, a first insulator surrounding each of the two first wires along the longitudinal axis, and a first conductive shield surrounding the first insulator along the longitudinal axis. The second twinaxial cable includes two second wires that are parallel or substantially parallel to each other along the longitudinal axis, a second insulator surrounding each of the two second wires along the longitudinal axis, and a second conductive shield surrounding the second insulator along the longitudinal axis. The first and second conductive shields are in direct contact with each other.

The cable ribbon preferably includes a drain wire. The drain wire preferably directly contacts the first conductive shield. The cable ribbon preferably includes at least one additional twinaxial cable that is arranged such that a conductive shield of the least one additional twinaxial cable is in direct contact with at least one of the first and second conductive shields. Each of the first and second insulators preferably includes a single continuous dielectric material that surrounds each of the first and second wires, respectively.

The first conductive shield preferably surrounds the first insulator such that there is no gap between the first conductive shield and the first insulator, and the second conductive shield preferably surrounds the second insulator such that there is no gap between the second conductive shield and the second insulator. The first and second insulators preferably include fluorinated ethylene propylene, polypropylene, polytetrafluoroethylene, perfluoroalkoxy, polyethelene, or a foamable insulative resin. The outer layer is preferably conductive.

According to a preferred embodiment of the present invention, a cable ribbon includes first and second twinaxial cables, at least one drain wire, and an outer layer surrounding the first and second twinaxial cables. The first twinaxial cable includes two first wires that are parallel or substantially parallel to each other along a longitudinal axis of the twinaxial cable ribbon, a first insulator surrounding each of the two first wires along the longitudinal axis, and a first conductive shield surrounding the first insulator along the longitudinal axis. The second twinaxial cable includes two second wires that are parallel or substantially parallel to each other along the longitudinal axis, a second insulator surrounding each of the two second wires along the longitudinal axis, and a second conductive shield surrounding the second insulator along the longitudinal axis. The total number of the at least one drain wire is less than the total number of the first and second twinaxial cables.

The first and second conductive shields are preferably in direct contact with each other. The drain wire preferably directly contacts the first conductive shield. The cable ribbon preferably includes at least one additional twinaxial cable that is arranged such that a conductive shield of the least one additional twinaxial cable is in direct contact with at least one of the first and second conductive shields. Each of the first and second insulators includes a single continuous dielectric material that surrounds each of the first and second wires, respectively.

The first conductive shield preferably surrounds the first insulator such that there is no gap between the first conductive shield and the first insulator, and the second conductive shield preferably surrounds the second insulator such that there is no gap between the second conductive shield and the second insulator. The first and second insulators preferably include fluorinated ethylene propylene, polypropylene, polytetrafluoroethylene, perfluoroalkoxy, polyethelene, or a foamable insulative resin. The outer layer is preferably conductive.

According to a preferred embodiment of the present invention, an electrical assembly includes an electrical connector and a cable ribbon according to one of the above-described preferred embodiments of the present invention connected to the electrical connector.

According to a preferred embodiment of the present invention, an electrical assembly includes a printed circuit board and a cable ribbon according to one of the above-described preferred embodiments of the present invention connected to the printed circuit board.

The above and other features, elements, characteristics and advantages of the present invention will become more apparent from the following detailed description of preferred embodiments of the present invention with reference to the attached drawings.

BRIEF DESCRIPTION OF THE DRAWINGS

FIGS. 9C and 9D show the twinaxial cable ribbon of FIGS. 9A and 9B without the over-molded housing.

FIGS. 10A and 10B show a twinaxial cable ribbon with a standard connector according to a preferred embodiment of the present invention.

FIGS. 10C and 10D show the twinaxial cable ribbon of FIGS. 10A and 10B without the standard connector.

FIGS. 11A and 11B show a twinaxial cable ribbon with a direct-connect connector according to a preferred embodiment of the present invention.

FIGS. 11C and 11D show the twinaxial cable ribbon of FIGS. 11A and 11B without the direct-connect connector.

FIGS. 12A-12C show a twinaxial cable ribbon with a connector with strain relief according to a preferred embodiment of the present invention.

FIG. 12D show the twinaxial cable ribbon of FIGS. 12A and 12B without the connector with strain relief.

DETAILED DESCRIPTION OF THE PREFERRED EMBODIMENTS

Figure 1:
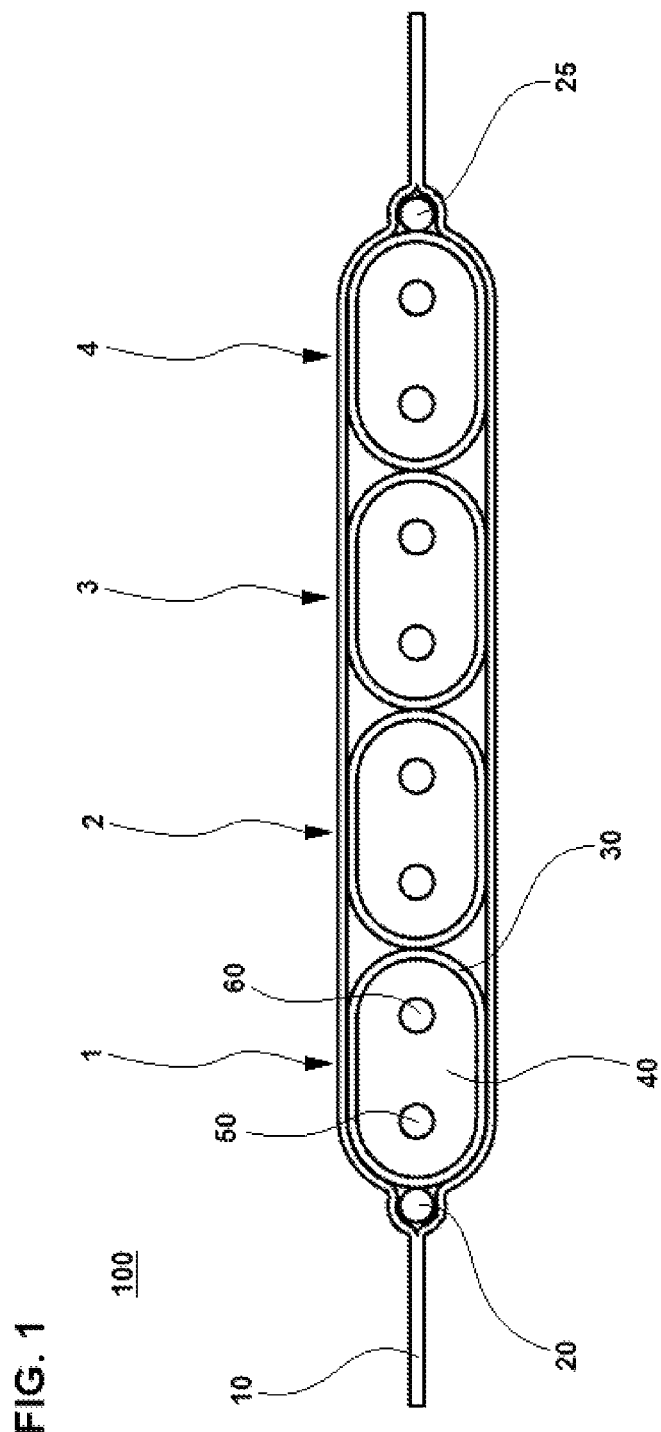
FIG. 1 shows a cross-sectional view of a twinaxial cable ribbon according to a preferred embodiment of the present invention.
Figure 2:
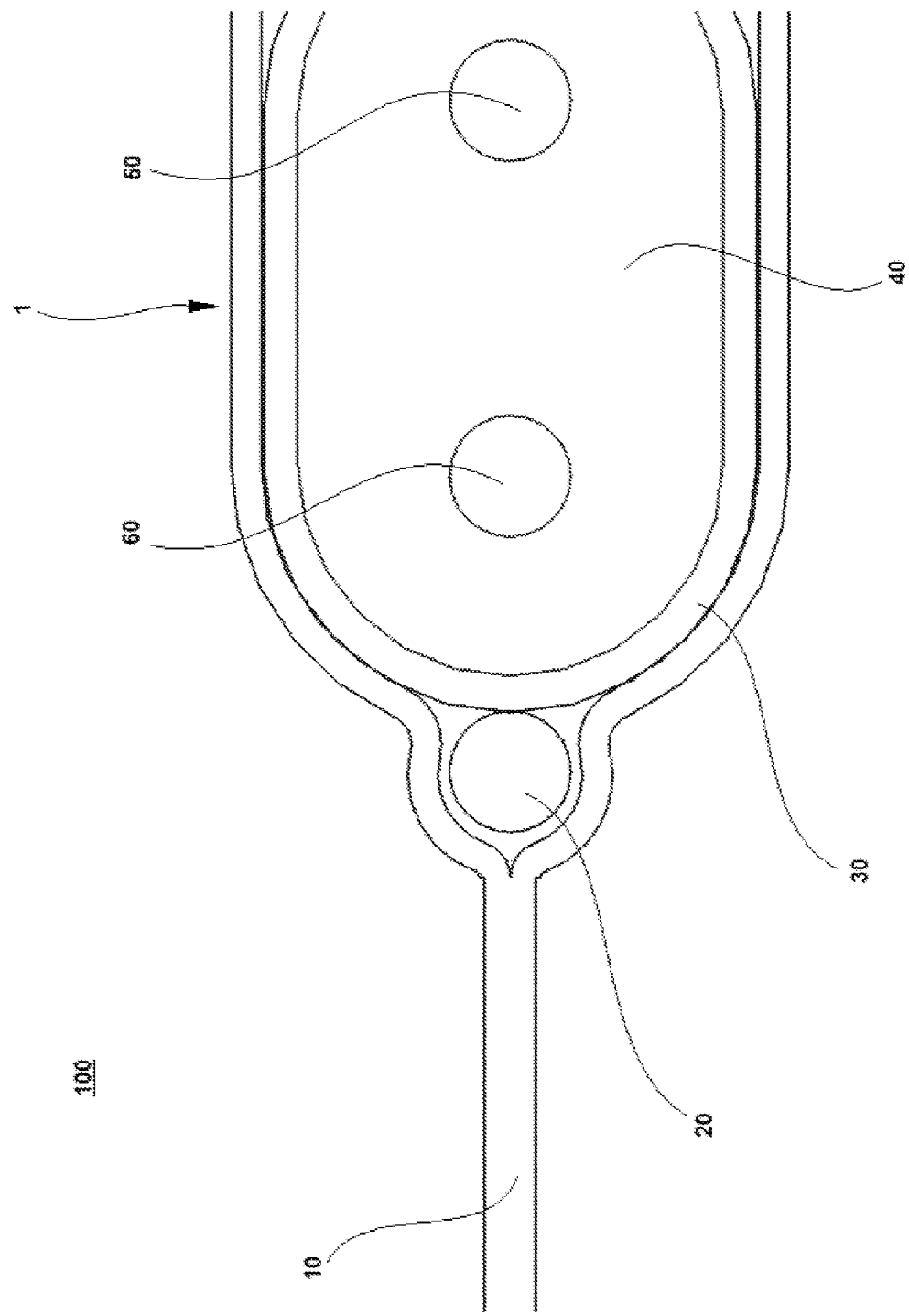
FIG. 2 shows a close-up cross-sectional view of one of the twinaxial cables of the twinaxial cable ribbon shown in FIG. 1.
Figure 3:
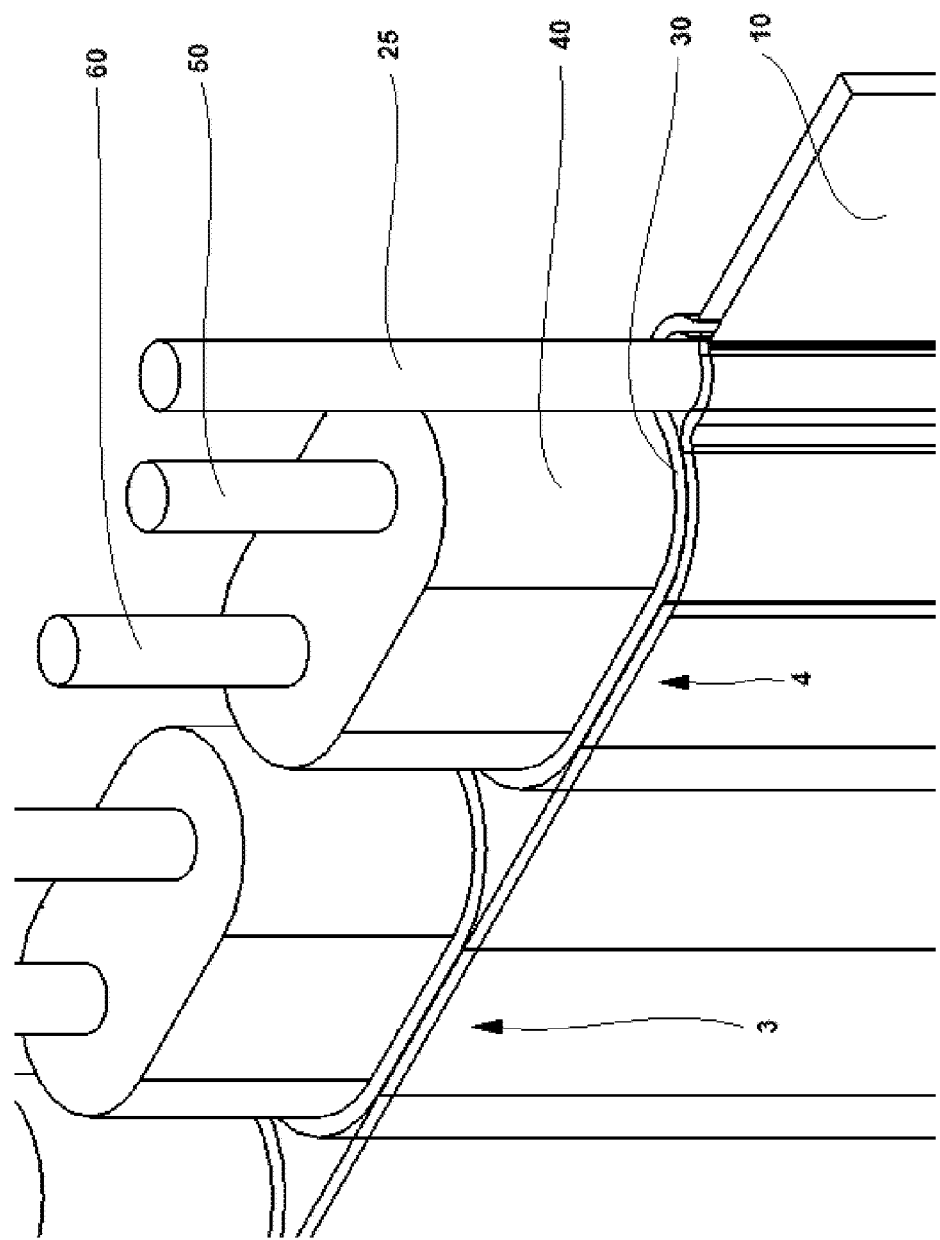
FIG. 3 is a close-up, partial perspective view of the twinaxial cable ribbon shown in FIG. 1.
Figure 4:
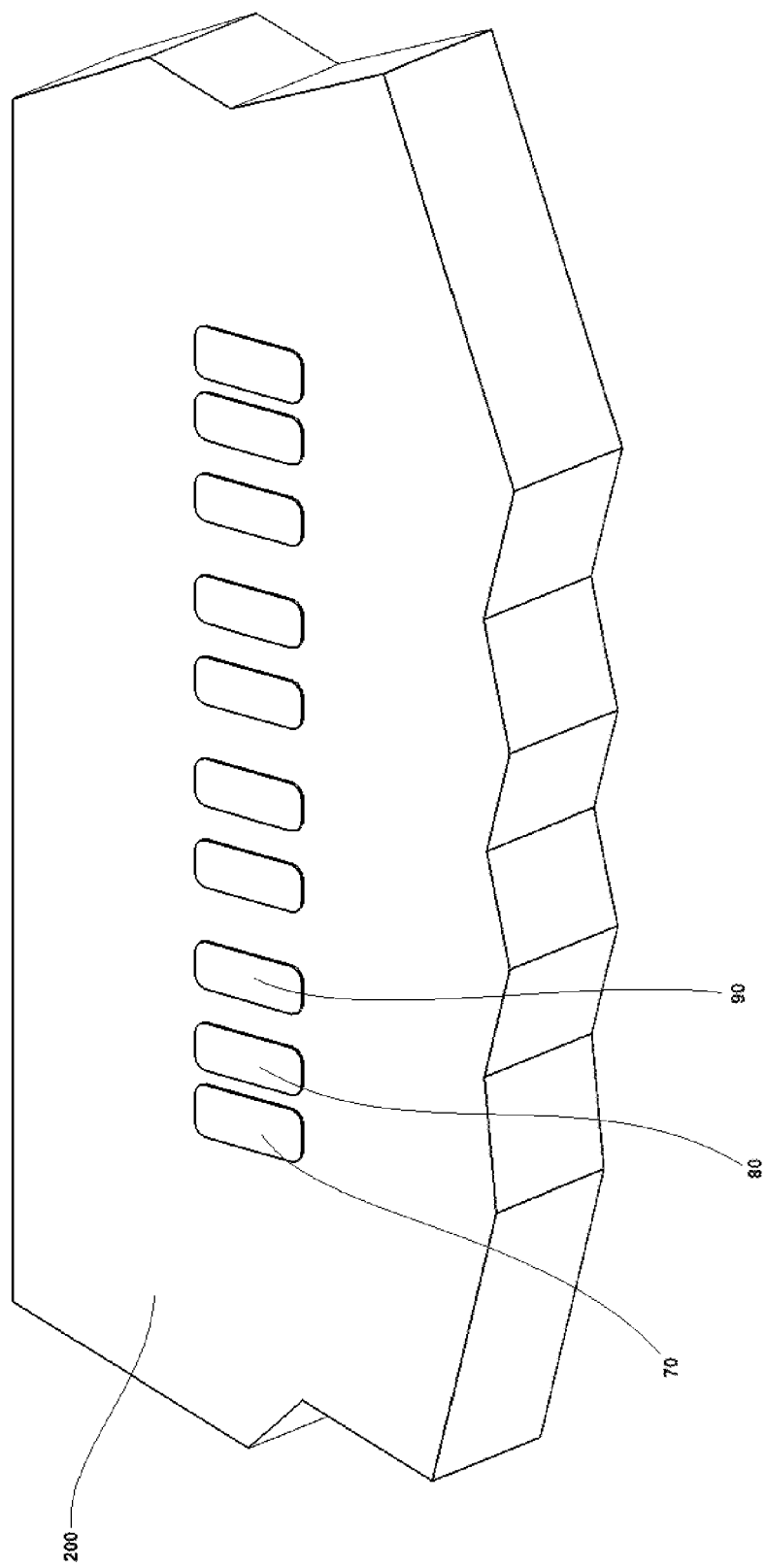
FIG. 4 shows a circuit board according to a preferred embodiment of the present invention.
Figure 5:
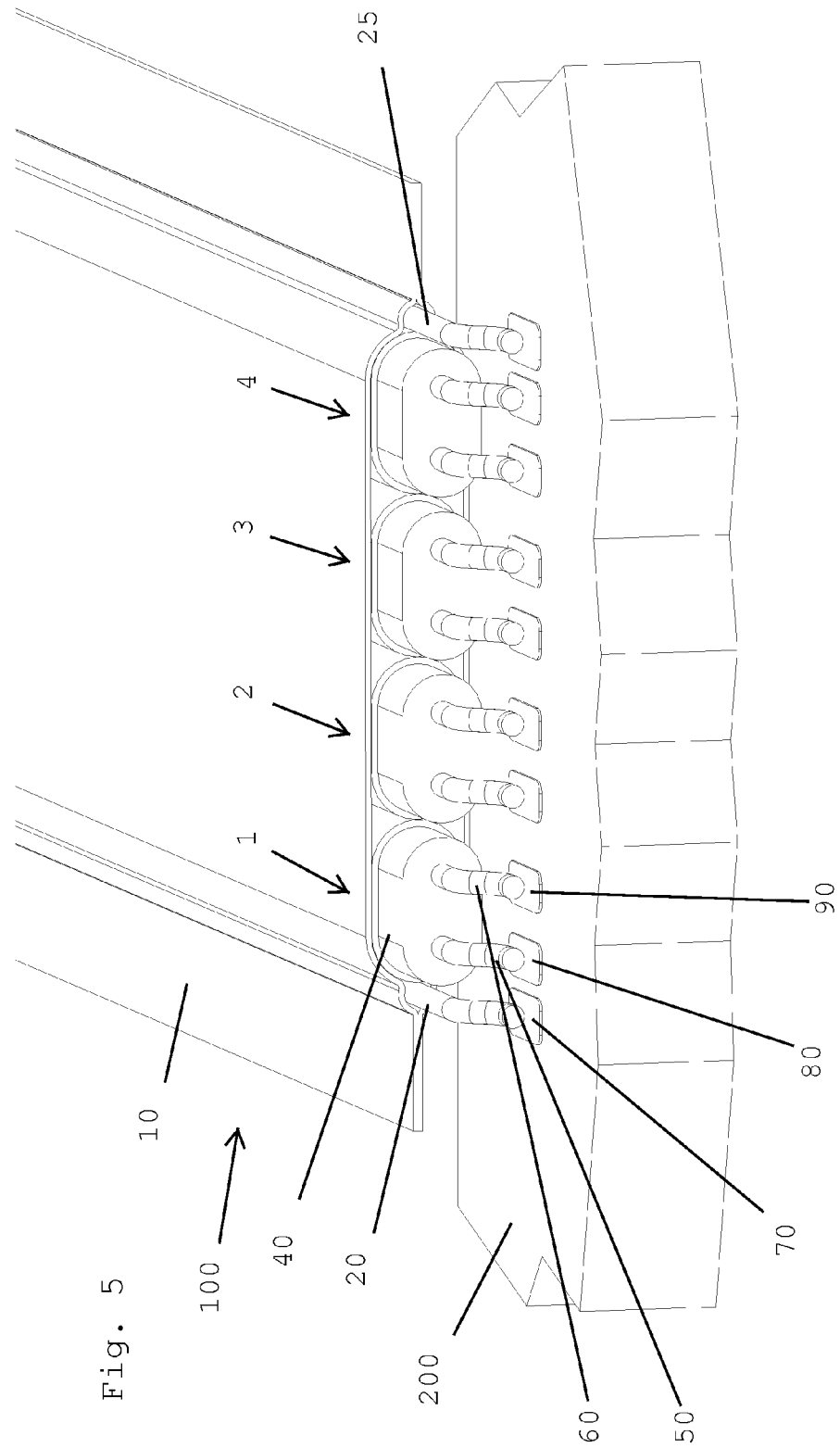
FIG. 5 shows the twinaxial cable ribbon shown in FIG. 1 connected to the circuit board shown in FIG. 4 according to a preferred embodiment of the present invention.
Figure 6:
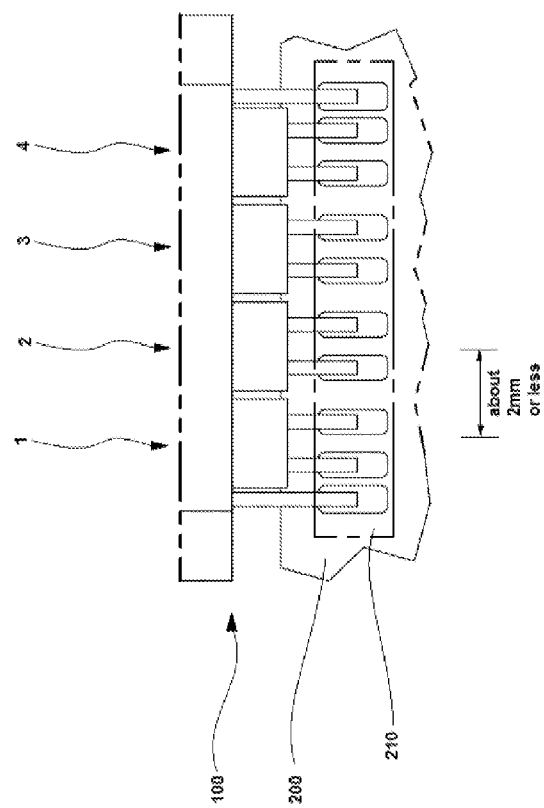
FIG. 6 shows a planar view of FIG. 5.
Figure 8:
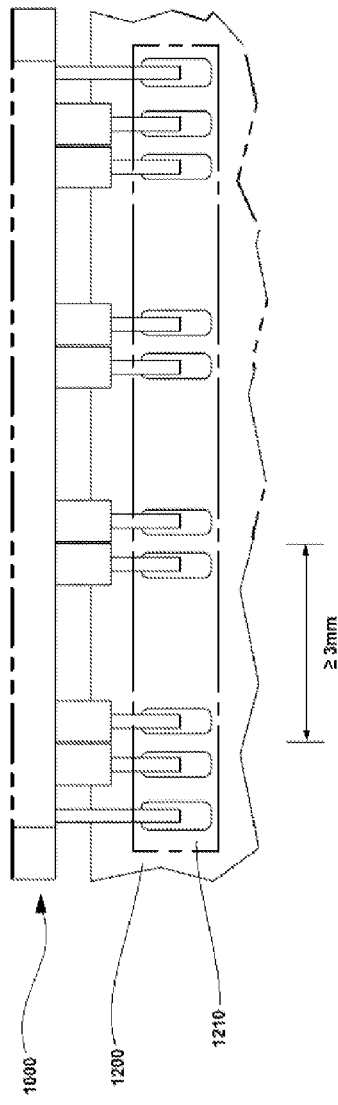
FIG. 8 shows a conventional twinaxial cable ribbon connected to a circuit board.
Figure 7:
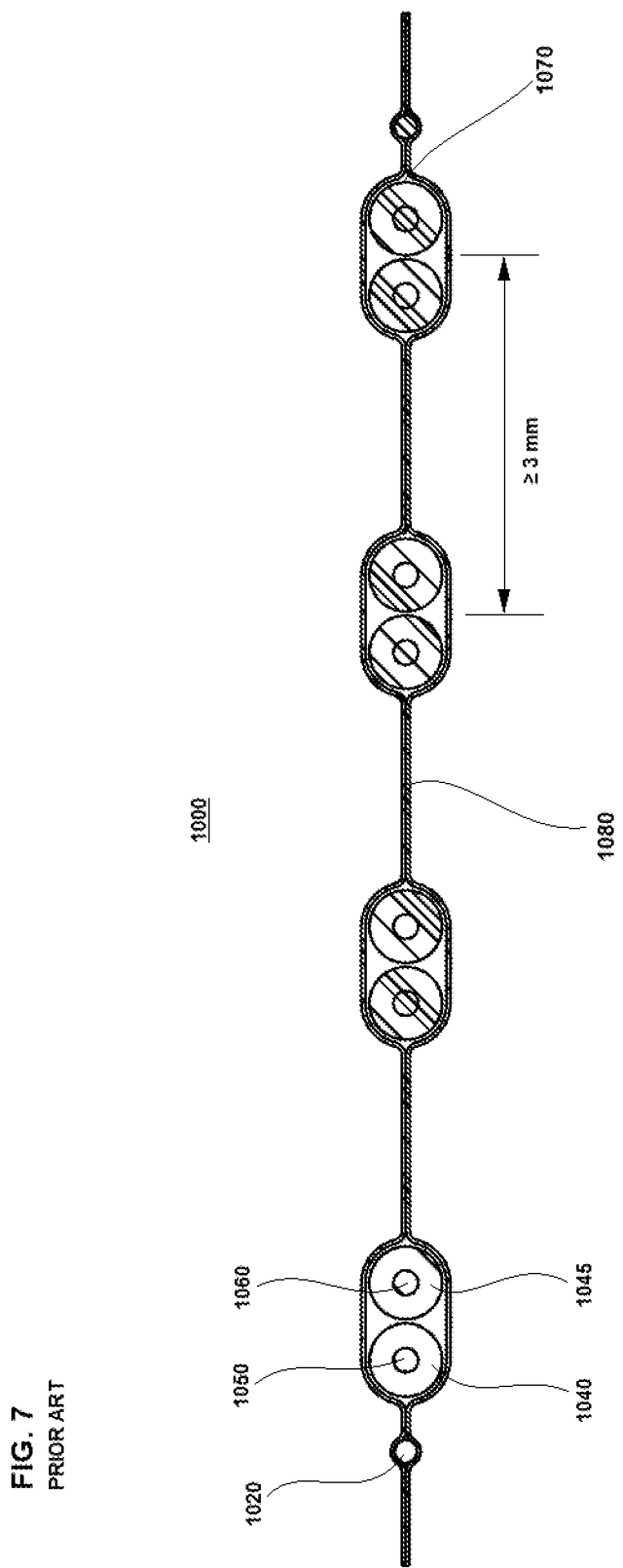
FIG. 7 shows a conventional twinaxial cable ribbon.

Preferred embodiments of the present invention will now be described with reference to FIGS. 1 to 6 and FIGS. 9A-12D. FIGS. 1 to 3 show a twinaxial cable ribbon 100 according to a preferred embodiment of the present invention. FIG. 4 shows a circuit board 200 according to a preferred embodiment of the present invention. FIGS. 5 and 6 show the twinaxial cable ribbon 100 shown in FIGS. 1 to 3 connected to the circuit board 200 shown in FIG. 4 according to a preferred embodiment of the present invention. FIGS. 9A-12D show the twinaxial ribbon 100 with various connectors according to several preferred embodiments of the present invention.

FIG. 1 shows a cross-sectional view of the twinaxial cable ribbon 100 according to a preferred embodiment of the present invention. The twinaxial cable ribbon 100 includes an outer layer 10, at least one drain wire 20, and at least one twinaxial cable 1. Twinaxial cable 1 includes a conductive shield 30, an insulator 40, a first conductor 50, and a second conductor 60.

In a preferred embodiment of the present invention, the twinaxial cable ribbon 100 further includes additional twinaxial cables 2-4 and an additional drain wire 25. It is possible to use two or three twinaxial cables or five or more twinaxial cables. Preferably, the additional twinaxial cables 2-4 are formed of materials that are the same as, or are similar to, the materials of the twinaxial cable 1. Preferably, elements of the additional twinaxial cables 2-4 have shapes and sizes that are the same as, or are similar to, the shapes and sizes of the elements of the twinaxial cable 1. The additional drain wire 25 is preferably formed of materials that are the same as, or are similar to, the materials of the drain wire 20, and the additional drain wire preferably has a shape and a size that is the same as, or is similar to, the shape and the size of the drain wire 20.

FIG. 2 shows a cross-sectional view of the twinaxial cable 1 of the twinaxial cable ribbon 100 shown in FIG. 1. FIG. 3 shows a close-up, partial perspective view of the twinaxial cable ribbon 100 shown in FIG. 1.

The insulator 40 is preferably formed of a single continuous dielectric material that surrounds both the first conductor 50 and the second conductor 60. Forming the insulator 40 as a single continuous dielectric material allows for the insulator to be manufactured by a single extrusion step for insulating both the first conductor 50 and the second conductor 60.

The insulator 40, when formed of a single continuous dielectric material as described above, preferably has a convex shape in the cross-sectional plane illustrated in FIG. 1. Instead of the convex shape shown in FIG. 1, the insulator 40 can also have round, oval, rectangular, or square cross-sectional shape or any other suitable shape.

According to a preferred embodiment of forming the insulator 40 of a single continuous dielectric material, a constant distance is provided between the first conductor 50 and the second conductor 60, even when the twinaxial cable ribbon 100 is subjected to twisting, bending, stretching, and the like. Furthermore, this preferred embodiment provides the first conductor 50 and the second conductor 60 with identical or substantially identical electrical properties.

The insulator layer 40 is preferably formed of a dielectric material with a low permittivity, such as fluorinated ethylene propylene (FEP), polypropylene, polytetrafluoroethylene (PTFE), perfluoroalkoxy (PFA), polyethelene, polyvinyl chloride (PVC), tetrafluoroethylene/hexafluoropropylene/vinylidene fluoride copolymer (THV), thermoplastic polyurethanes (TPU), or other suitable dielectric material. Preferably, a lower-cost dielectric, such as polypropylene, is used for the insulator layer 40, to reduce the overall cost of the twinaxial cable ribbon 100. Since the drain wire 20 and the additional drain wire 25 provide a ground connection for the twinaxial cable ribbon 100, it is not necessary to solder a served or braided conductive shield on the twinaxial cable ribbon 100 using a hot bar solder method that would require a higher-cost dielectric, such as FEP.

Furthermore, the dielectric material may be formed of a foamable insulative resin. Preferably, the foamable insulative resin may be formed by mixing a foamable agent into a resin prior to molding the dielectric material and controlling a foaming level of the resin according to a molding temperature, or by injecting a gas (for example, nitrogen) into a resin at a molding pressure and forming the resin by a pressure release.

The components of additional twinaxial cables 2-4 and the additional drain wire 25 are preferably materially and structurally identical or substantially identical to the components of twinaxial cable 1 and drain wire 20, respectively. The additional twinaxial cables 2-4 can include different structures, materials, and the like. As one example, one or more of the twinaxial cables 1-4 may include different materials for the insulator layer 40. It is also possible to use a coaxial cable and/or a power cable in addition or as a replacement of one or more of the twinaxial cables 1-4.

Preferably, the structures, materials, and the like of the twinaxial cables 1-4 are chosen, for example, according to the respective signals to be carried on each of the first and second conductors 50, 60, and/or according to the specific operating environment for the twinaxial cable ribbon 100.

The first conductor 50 and the second conductor 60 may be stranded, braided, or solid, and are preferably formed of a material such as non-plated copper or copper alloy, a plated copper or copper alloy, or the like. Suitable materials for plating include, for example, silver, tin, gold, aluminum, zinc, nickel, and electroless nickel palladium immersion gold (ENEPIG).

The conductive shield 30 is preferably formed of a material such as aluminum foil, aluminum Mylar, or the like. It is also possible to use copper, copper alloy, silver, tin, gold, aluminum, zinc, nickel, and ENEPIG. The conductive shield 30 preferably covers the insulator 40 such that there is no tangent shield gap between the conductive shield 30 and the insulator 40. In addition, the conductive shields 30 of adjacent twinaxial cables 1-4 are preferably in contact with each along the entire length or substantially the entire length of the twinaxial cables 1-4.

The drain wire 20 and the additional drain wire 25 are preferably disposed between the outer layer 10 and the conductive shield 30. The drain wires 20, 25 are preferably in contact with the conductive shields 30 of the twinaxial cable 1, 4 adjacent to the drain wires 20, 25 along the entire length or substantially the entire length of the twinaxial cables 1, 4. It is also possible that the drain wires 20, 25 could be located between the conductive shield 30 and insulator 40. Because the drain wires 20, 25 are in contact with the conductive shields of the twinaxial cable 1, 4 adjacent to the drain wires 20, the resistance of the twinaxial cable ribbon 100 can be reduced.

Instead of using the drain wires 20, 25, it is possible to use no drain wires or to use three or more drain wires. The drain wires 20, 25 is preferably made of the same materials as the first and second conductors 50, 60, including non-plated copper or copper alloy, a plated copper or copper alloy, or the like, where suitable materials for plating include, for example, silver, tin, gold, aluminum, zinc, nickel, and electroless nickel palladium immersion gold (ENEPIG).

In a preferred embodiment, a center longitudinal axis of the drain wire 20, a center longitudinal axis of the first conductor 50, and a center longitudinal axis of the second conductor 60 are all parallel or substantially parallel and co-planar or substantially co-planar with each other. That is, in the cross-sectional views illustrated in FIGS. 1 and 2, the respective center points of the drain wire 20, the first conductor 50, and the second conductor 60 are all co-linear or substantially co-linear. That is, the center-conductor-to-center-conductor distance is preferably constant so that the first and second conductors 50, 60 are parallel. The first and second conductors 50, 60 can also be substantially parallel within manufacturing tolerances. For example, as the filing of this application, the center-conductor-to-center-conductor distance tolerance is ±0.001" at a >1.4 CpK, and the co-planarity are within about ±0.004". However, the manufacturing tolerances are expected to change over time. The co-planarity tolerance is typically not as critical as the parallel tolerance because the circuit board to which the twinaxial cable ribbon is attached will create co-planarity.

Furthermore, the respective center longitudinal axes of the respective conductors of the additional twinaxial cables 2-4 and the additional drain wire 25 are preferably all parallel or substantially parallel and co-planar or substantially co-planar to the center longitudinal axes of the drain wire 20, the first conductor 50, and the second conductor 60.

Preferably, the drain wire 20 is in electrical contact with the conductive shield 30 along the entire length or substantially the entire length of the twinaxial cable ribbon 100. Preferably, the drain wire 20 is in contact with the conductive shield 30 along the portion of the twinaxial cable ribbon 100 that is covered by outer layer 10, and the drain wire 20 and the conductive shield 30 are separated only at the ends of the twinaxial cable ribbon 100. In a preferred embodiment, the drain wire 20 is substantially tangential to the conductive shield 30 along substantially the entire length of the twinaxial cable ribbon 100. Preferably, the additional drain wire 25 is arranged in a similar manner as the drain wire 20.

Preferably, the respective conductive shield 30 of each of the twinaxial cables 1-4 is in contact with the conductive shield(s) of any adjacent twinaxial cable of the twinaxial cables 1-4. For example, the conductive shield 30 of the additional twinaxial cable 2 is preferably in contact with both the conductive shield 30 of twinaxial cable 1 and the conductive shield 30 of additional twinaxial cable 3.

The outer layer 10 is preferably laminated and is preferably formed of metalized (preferably aluminized) polyethylene terephthalate (PET) tape, a semi-transparent tape with a thermally set conductive adhesive, or other suitable material, for example. Many suitable structures could be used, including, for example, a laminate of alternating insulating and conductive layers. The insulating materials could be, for example, the material used to laminate paper.

FIG. 4 shows a circuit board 200 according to a preferred embodiment of the present invention. Preferably, the circuit board 200 includes at least one drain wire pad 70, at least one first conductor pad 80, and at least one second conductor pad 90. Preferably, drain wire pad 70 is connected to ground. In a preferred embodiment, drain wire pad 70 is electrically connected to a ground plane of the circuit board 200.

FIG. 5 shows the twinaxial cable ribbon 100 shown in FIG. 1 connected to the circuit board 200 shown in FIG. 4 according to a preferred embodiment of the present invention. As shown in FIG. 5, the drain wire 20 is connected to the drain wire pad 70, the first conductor 50 is connected to the first conductor pad 80, and the second conductor 60 is connected to the second conductor pad 90.

Figure 9A:
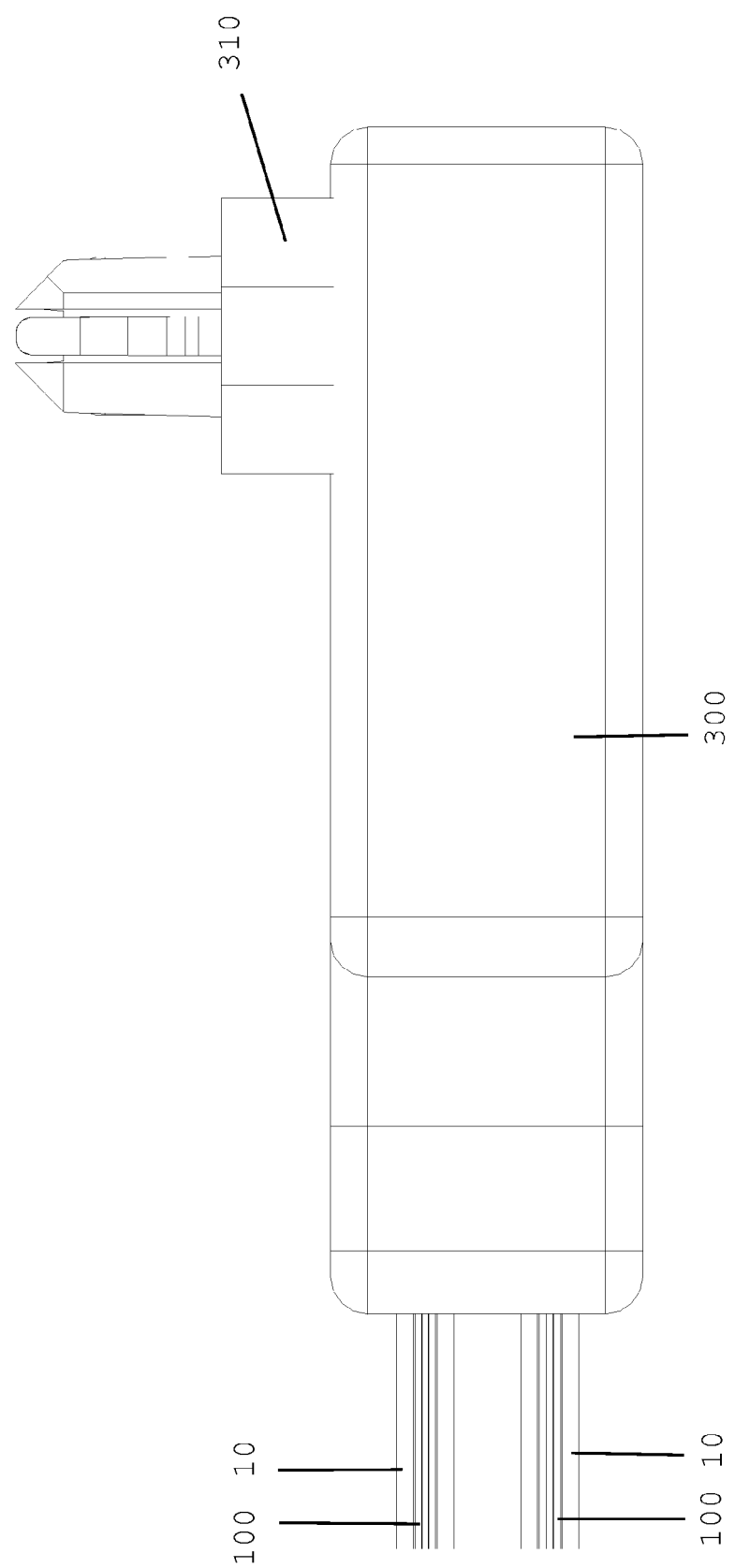
FIGS. 9A and 9B show a twinaxial cable ribbon with an over-molded housing according to a preferred embodiment of the present invention.
Figure 9B:
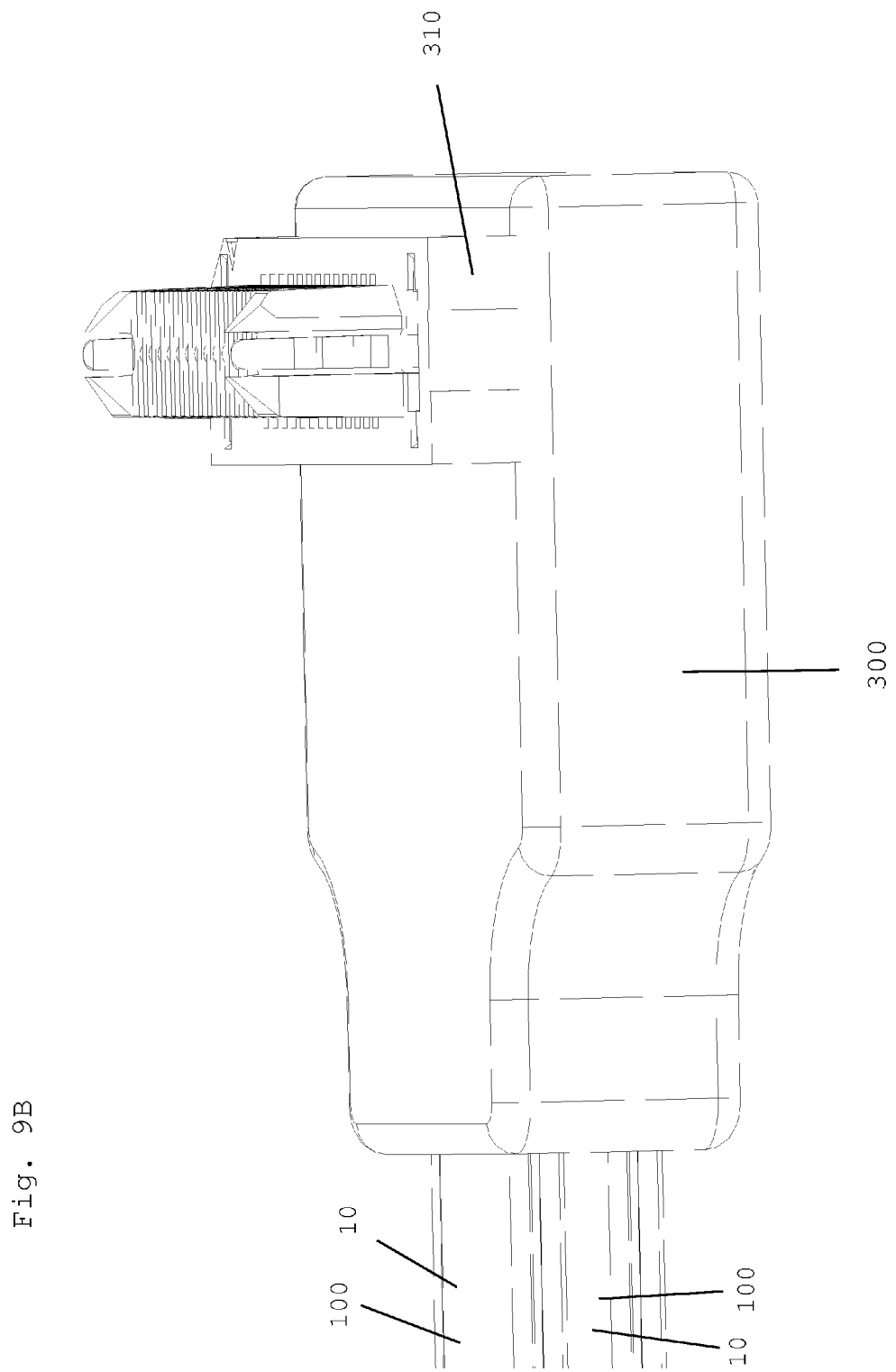

Since the drain wire 20 and the additional drain wire 25 of the twinaxial cable ribbon 100 provide a ground connection, and since each of the conductive shields 30 of cable 1-4 are electrically connected, it is not necessary to solder the conductive shields 30 of the twinaxial cable ribbon 100 using a hot bar solder method. Accordingly, in a preferred embodiment, a single hot bar soldering step can be used to solder the drain wires 20, 25 and the first and second conductors 50, 60 of the twinaxial cable ribbon 100 to their corresponding conductor pads 70, 80, 90 of the circuit board 200, and no other soldering or connecting operation is necessary. Instead of using hot bar soldering, it is also possible to use crimping to create the connections. Preferably, a UV curable epoxy or over-molding is used for strain relief; however, instead of using the UV curable epoxy or over-molding, it is possible to use a mechanical or other suitable strain relied device. FIGS. 9A and 9B shows the twinaxial cable ribbon 100 with an over-molded housing 300, and FIG. 12C shows the twinaxial cable ribbon 100 with a strain relief connector 600 with mechanical strain relief, i.e. projections 640 that provide strain relief by bending the twinaxial cable ribbon 100.

Since no spacing is required between each of the cables 1-4 in the twinaxial cable ribbon 100, the center-conductor-to-center-conductor distance between any two adjacent ones of the cables 1-4 is preferably about 2 mm or less. For example, it is possible to achieve center-conductor-to-center-conductor distances as small as about 1.77 mm using 30 gage first and second conductors 50, 60. However, it possible to achieve even smaller center-conductor-to-center-conductor distances with larger gage wire, for example, 32-38 gage wire.

Accordingly, the circuit board 200 has a small footprint area 210 for connecting to the twinaxial cable ribbon 100. That is, the surface area required on the circuit board 200 for the conductor pads 70, 80, 90 is relatively compact, according to the close arrangement of the first and second conductors 50, 60 of the twinaxial cable ribbon 100. Thus, the close arrangement of the conductors of the twinaxial cable ribbon 100 provides a higher-density cable that may reduce the cost of a system that uses the twinaxial cable ribbon 100. FIG. 6 shows a planar view of the twinaxial cable ribbon 100 connected to the circuit board 200, illustrating a footprint area 210 on the circuit board 200 where the twinaxial cable ribbon 100 is connected.

In addition to being connected to the circuit board 200, the twinaxial cable ribbon 100 can be connected to an electrical connector as shown in FIGS. 9A-12D. FIGS. 9A-9D show twinaxial cable ribbons 100 connected to an over-molded housing 300. FIGS. 10A-10D show twinaxial cable ribbons 100 connected to a standard connector 400. FIGS. 11A-11D show a twinaxial cable ribbon 100 connected to a direct-attach connector 500. FIGS. 12A-12D show twinaxial cable ribbon 100 connected to a strain relief connector 600.

Figure 9C:
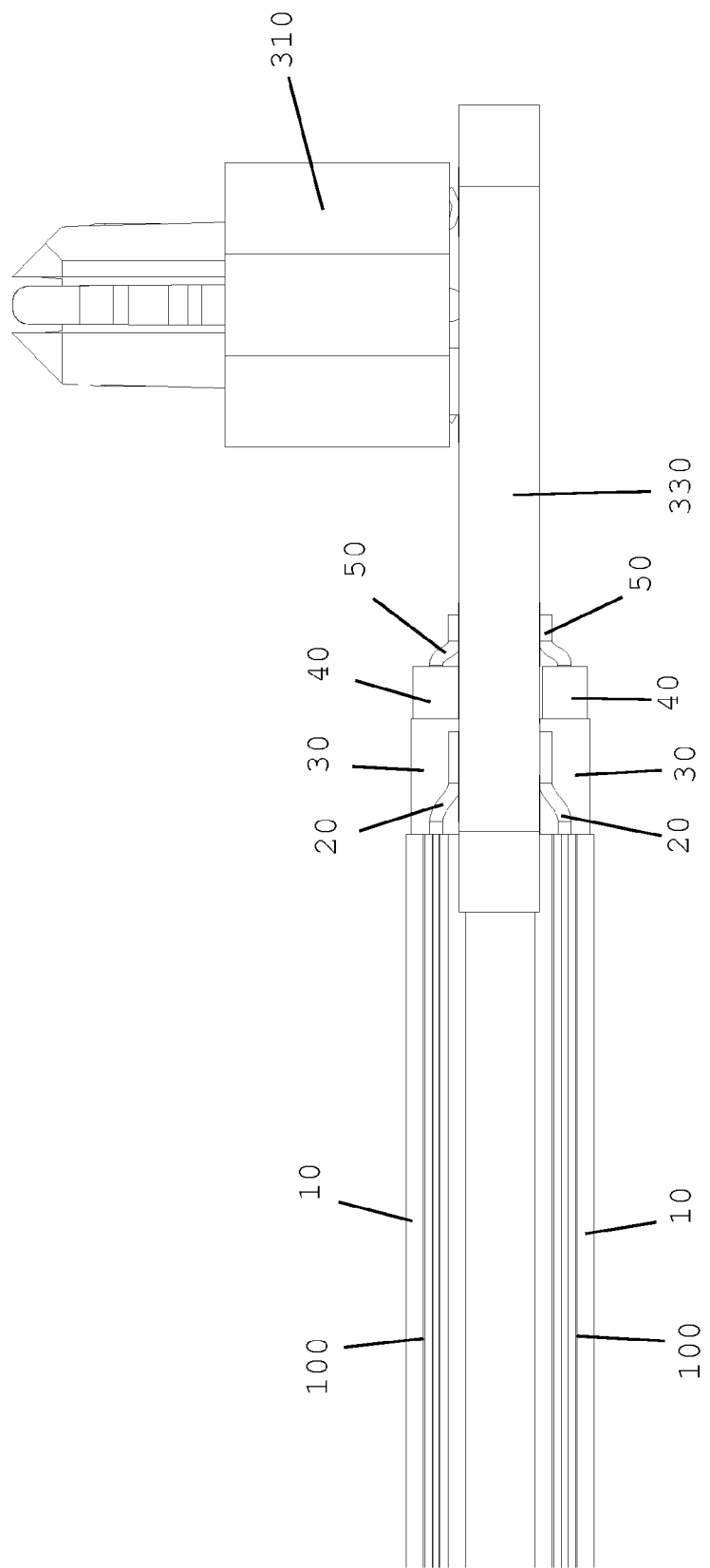

FIGS. 9A and 9B show two twinaxial cable ribbons 100 connected to an over-molded housing 300. FIGS. 9C and 9D show the twinaxial cable ribbons 100 without the over-molded housing 300 and connected to a circuit board 330. Although two twinaxial ribbons 100 are shown, any number of twinaxial ribbons 100 could be used, and although the two twinaxial ribbons 100 are shown in a stacked arrangement where one of the twinaxial ribbons 100 is connected to the top of the circuit board 330 and the other of the twinaxial ribbons 100 is connected to the bottom of the circuit board 330, it is possible to use any suitable arrangement used including providing multiple twinaxial ribbons 100 along a single surface of the circuit board 330. The circuit board 330 is connected to a right angle connector 310; however any suitable connector, including a parallel connector that extends parallel to the circuit board 330, could be used. The drain wires 20, 25, the first conductor 50, and the second conductor 60 are connected to corresponding pads on the circuit board 330. The over-molded housing 300 is formed by an over-molding process such that a portion of the twinaxial cable ribbons 100 near where the twinaxial cable ribbons 100 are connected the circuit board 330 is encased in the over-molding material, resulting in the arrangement shown in FIGS. 9A and 9B where the twinaxial cable ribbons 100 are connected to the over-molded housing 300.

Figure 10D:
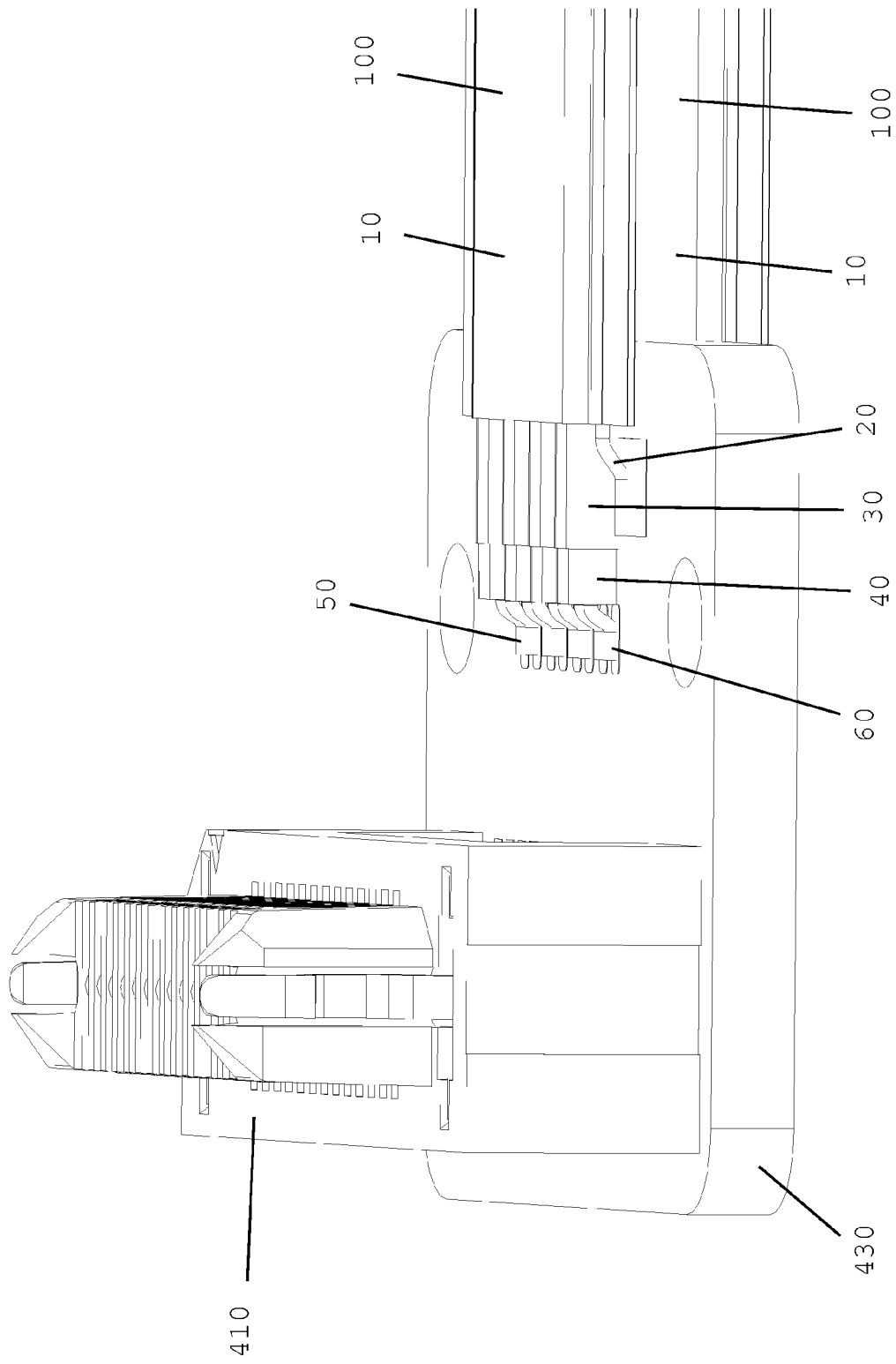

FIGS. 10A and 10B show two twinaxial cable ribbons 100 connected to a standard connector 400. FIGS. 10C and 10D show the twinaxial cable ribbons 100 without the standard connector 400 and connected to a circuit board 430. As with the preferred embodiment shown in FIGS. 9A-9D, any number and arrangement of twinaxial ribbons 100 could be used. The circuit board 430 is connected to a right angle connector 410; however, as with the preferred embodiment shown in FIGS. 9A-9D, any suitable connector could be used. The drain wires 20, 25, the first conductor 50, and the second conductor 60 are connected to corresponding pads on the circuit board 430. The standard connector 400 is preferably formed in two parts that can be connected with screws 420.

Instead of connecting the standard connector 400 with screws 420, any other suitable method of connecting the standard connector 400 can be used.

Figure 11A:
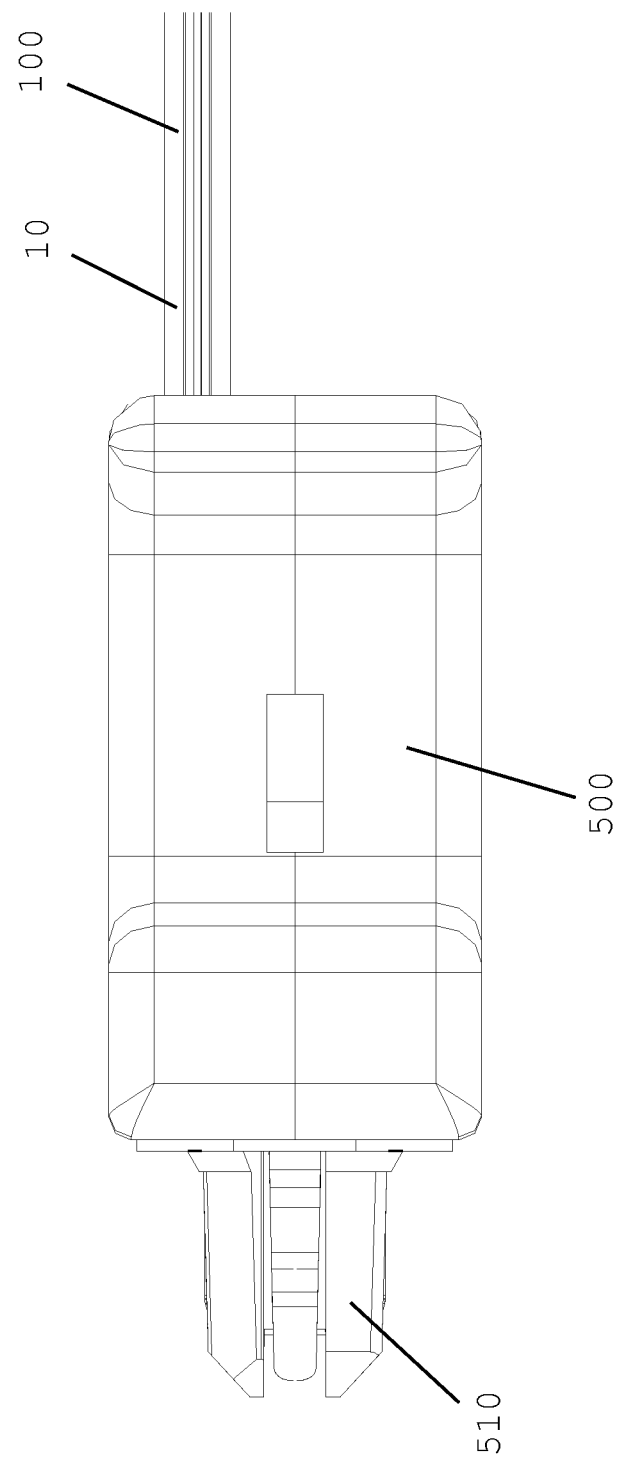

FIGS. 11A and 11B show a twinaxial cable ribbon 100 connected to a direct-attach connector 500. FIGS. 11C and 11D show the twinaxial cable ribbon 100 without the direct-attach connector 500 and connected to a parallel connector 510. As with the preferred embodiments shown in FIGS. 9A-10D, any number and arrangement of twinaxial ribbons 100 could be used. The direct-attach connector 500 does not use a circuit board. The twinaxial cable ribbon 100 is connected to the parallel connector 510 without using a circuit board; however, as with the preferred embodiments shown in FIGS. 9A-10D, any suitable connector could be used. For simplicity, FIGS. 11B and 11D only shown a portion of the contacts 550. The first conductor 50 and the second conductor 60 are directly connected to corresponding contacts 550 within the parallel connector 510. The drain wires 20, 25 are preferably connected to ground bar 560, which is connected to a corresponding contact 550. The direct-attach connector 500 is preferably formed in two parts that can be connected by riveting, ultrasonically welding, fastening together with screws or other suitable faster, or by any other suitable method.

Figure 12A:
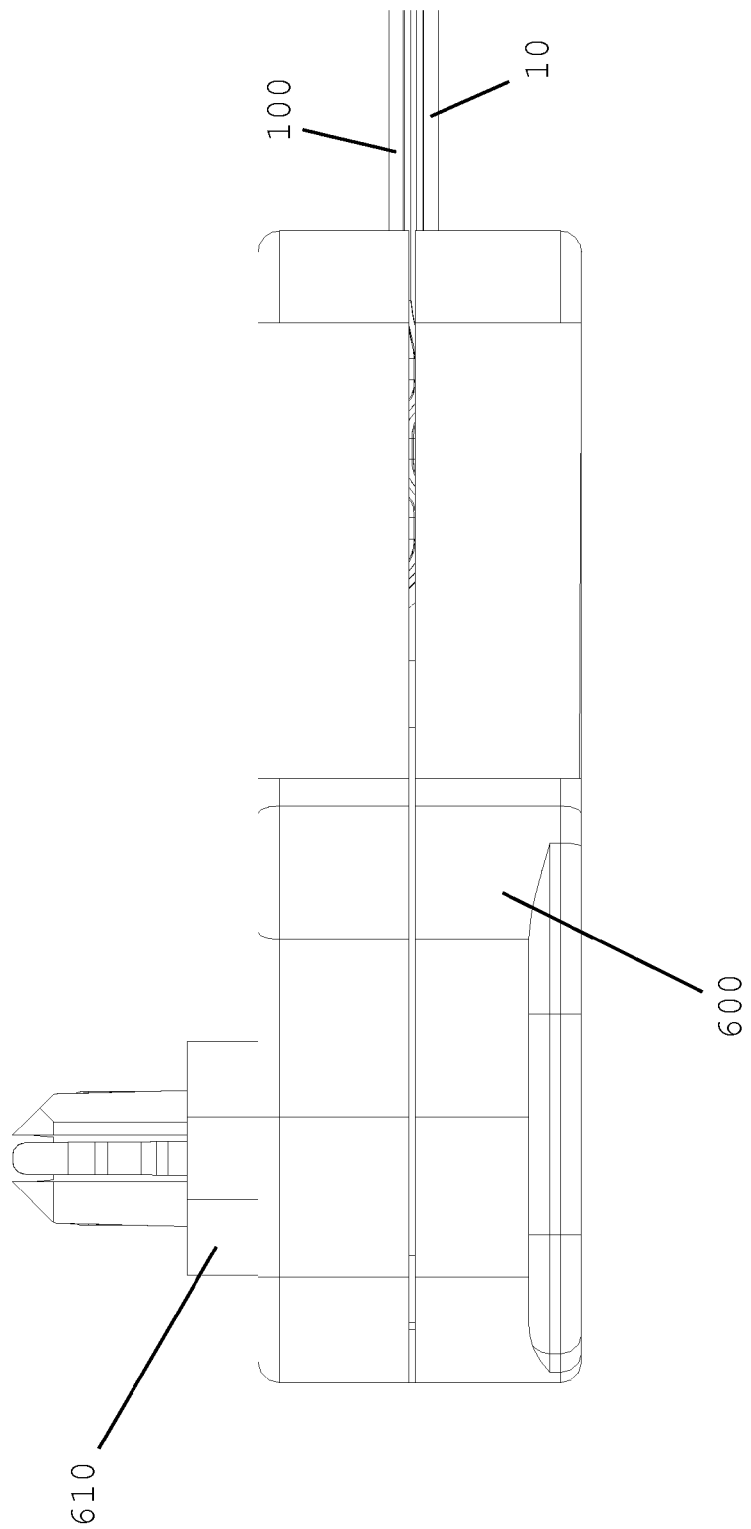
Figure 12C:
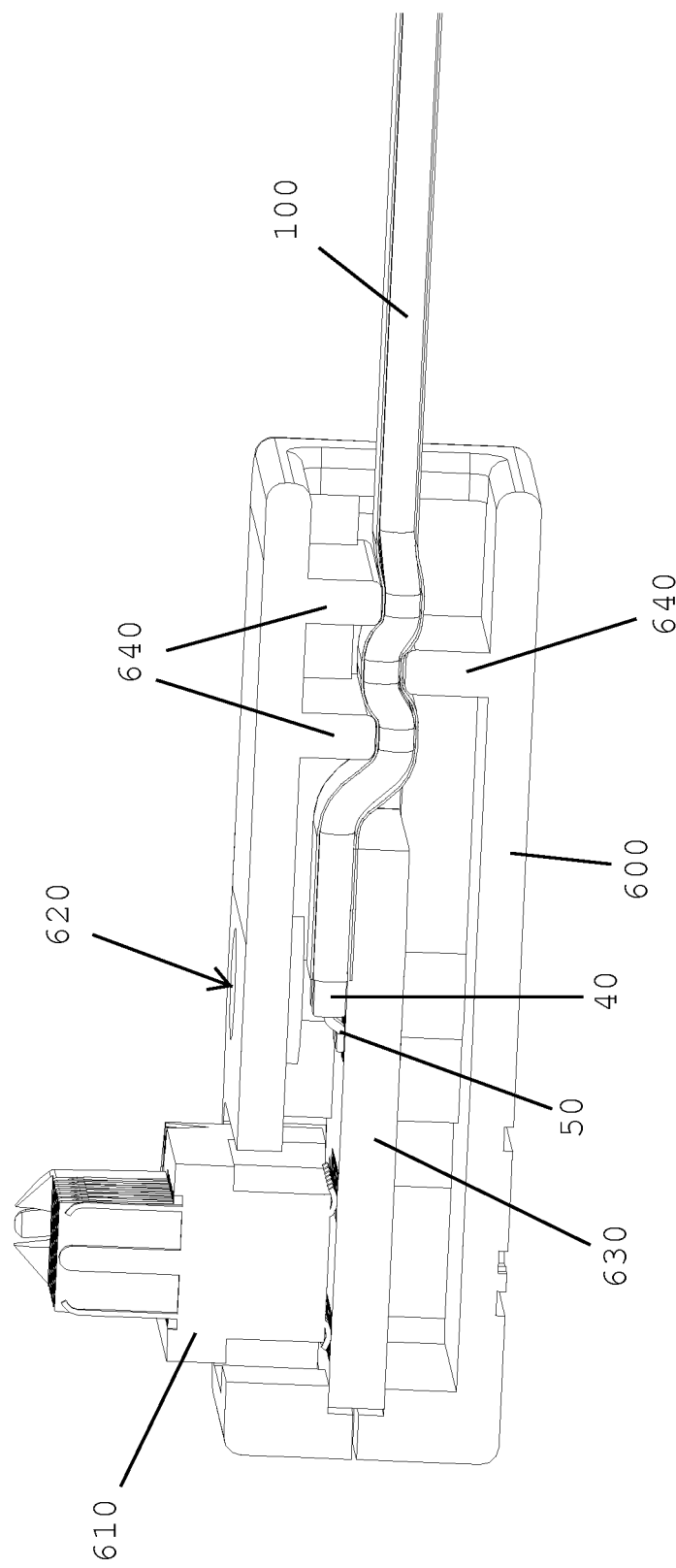

FIGS. 12A-12C show a twinaxial cable ribbon 100 connected to a strain relief connector 600. The strain relief connector 600 is similar to standard connector 400 shown in FIGS. 10A-10D, except that strain relief connector 600 only includes a single twinaxial ribbon 100 and includes projections 640. FIG. 12D shows the twinaxial cable ribbons 100 without the strain relief connector 600 in which the twinaxial ribbon 100 is connected to a circuit board 630. As with the preferred embodiments shown in FIGS. 9A-11D, any number and arrangement of twinaxial ribbons 100 could be used. The circuit board 630 is connected to a right angle connector 610; however, as with the preferred embodiments shown in FIGS. 9A-11D, any suitable connector could be used. The drain wires 20, 25, the first conductor 50, and the second conductor 60 are connected to corresponding pads on the circuit board 630. The strain relief connector 600 is preferably formed in two parts that can be connected with screws 620. Instead of connecting the strain relief connector 600 with screws 620, any other suitable method of connecting the strain relief connector 600 can be used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A cable ribbon comprising:
   a first twinaxial cable including:
      two first wires that are parallel or substantially parallel to each other along a longitudinal axis of the cable ribbon;
      a first insulator surrounding each of the two first wires along the longitudinal axis; and
      a first conductive shield surrounding the first insulator along the longitudinal axis;
   a second twinaxial cable including:
      two second wires that are parallel or substantially parallel to each other along the longitudinal axis;
      a second insulator surrounding each of the two second wires along the longitudinal axis; and
      a second conductive shield surrounding the second insulator along the longitudinal axis;

an outer layer surrounding the first and second twinaxial cables; and a drain wire extending along the entire or substantially the entire longitudinal axis and located at a first end of the cable ribbon in a direction perpendicular to the longitudinal axis such that the drain wire is directly adjacent to only one twinaxial cable and such that the drain wire directly physically contacts only one conductive shield; wherein the first and second conductive shields are in direct physical contact with each other.

2. A cable ribbon of claim 1, further comprising another drain wire.

3. A cable ribbon of claim 2, wherein the another drain wire extends along the length of the cable ribbon and is located at a second end of the cable ribbon in the direction perpendicular to the length of the cable ribbon.

4. A cable ribbon of claim 1, further comprising at least one additional twinaxial cable that is arranged such that a conductive shield of the least one additional twinaxial cable is in direct physical contact with at least one of the first and second conductive shields.

5. A cable ribbon of claim 1, wherein each of the first and second insulators includes a single continuous dielectric material that surrounds each of the first and second wires, respectively.

6. A cable ribbon of claim 1, wherein:
the first conductive shield surrounds the first insulator such that there is no gap between the first conductive shield and the first insulator; and
the second conductive shield surrounds the second insulator such that there is no gap between the second conductive shield and the second insulator.

7. A cable ribbon of claim 1, wherein the first and second insulators include fluorinated ethylene propylene, polypropylene, polytetrafluoroethylene, perfluoroalkoxy, polyethelene, or a foamable insulative resin.

8. A cable ribbon of claim 1, wherein the outer layer is conductive.

9. An electrical assembly comprising:
an electrical connector; and
a cable ribbon of claim 1 connected to the electrical connector.

10. An electrical assembly comprising:
a printed circuit board; and
a cable ribbon of claim 1 connected to the printed circuit board.

11. A cable ribbon comprising:
a first twinaxial cable including:
two first wires that are parallel or substantially parallel to each other along a longitudinal axis of the cable ribbon;
a first insulator surrounding each of the two first wires along the longitudinal axis; and
a first conductive shield surrounding the first insulator along the longitudinal axis;

a second twinaxial cable including:
two second wires that are parallel or substantially parallel to each other along the longitudinal axis;
a second insulator surrounding each of the two second wires along the longitudinal axis; and
a second conductive shield surrounding the second insulator along the longitudinal axis;
an outer layer surrounding the first and second twinaxial cables; and
a drain wire extending along the entire or substantially the entire longitudinal axis and located at a first end of the cable ribbon in a direction perpendicular to the longitudinal axis such that the drain wire is directly adjacent to only one twinaxial cable and such that the drain wire directly physically contacts only one conductive shield; wherein
no tangent shield gap is present between the first conductive shield and the first insulator; and
no tangent shield gap is present between the second conductive shield and the second insulator.

12. A cable ribbon of claim 11, wherein the first and second conductive shields are in direct physical contact with each other.

13. A cable ribbon of claim 11, further comprising another drain wire.

14. A cable ribbon of claim 11, further comprising at least one additional twinaxial cable that is arranged such that a conductive shield of the least one additional twinaxial cable is in direct contact with at least one of the first and second conductive shields.

15. A cable ribbon of claim 11, wherein each of the first and second insulators includes a single continuous dielectric material that surrounds each of the first and second wires, respectively.

16. A cable ribbon of claim 11, wherein:
the first conductive shield surrounds the first insulator such that there is no gap between the first conductive shield and the first insulator; and
the second conductive shield surrounds the second insulator such that there is no gap between the second conductive shield and the second insulator.

17. A cable ribbon of claim 11, wherein the first and second insulators include fluorinated ethylene propylene, polypropylene, polytetrafluoroethylene, perfluoroalkoxy, polyethelene, or a foamable insulative resin.

18. A cable ribbon of claim 11, wherein the outer layer is conductive.

19. An electrical assembly comprising:
an electrical connector; and
a cable ribbon of claim 11 connected to the electrical connector.

20. An electrical assembly comprising:
a printed circuit board; and
a cable ribbon of claim 11 connected to the printed circuit board.

* * * * *